United States Patent
Kishima

(10) Patent No.: US 7,592,682 B2
(45) Date of Patent: Sep. 22, 2009

(54) OPTICAL WAVEGUIDE AND PHOTORECEPTOR

(75) Inventor: Koichiro Kishima, Kanagawa (JP)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 11/562,519

(22) Filed: Nov. 22, 2006

(65) Prior Publication Data
US 2007/0114630 A1 May 24, 2007

(30) Foreign Application Priority Data
Nov. 24, 2005 (JP) .............................. P2005-339467

(51) Int. Cl.
*H01L 31/06* (2006.01)
(52) U.S. Cl. .............................. 257/462; 257/E31.073; 257/E31.053; 438/197
(58) Field of Classification Search ............... 257/462, 257/E33.076, E33.077, E31.053, E31.073, 257/E31.076, E31.079, E31.082; 438/197
See application file for complete search history.

(56) References Cited

U.S. PATENT DOCUMENTS
4,958,898 A * 9/1990 Friedman et al. ............... 385/3

OTHER PUBLICATIONS

Ruzlyllo, "Silicon-On-Insulator (SOI)", Jun. 20, 2003, PennState University.*
Nozawa, Tesuo; Increasing Penetration of optical transmission into a case of deice; Precedence by a roster or a portable telephone: Nikkei Electronics; Jun. 6, 2005; p. 59-p. 70.

* cited by examiner

*Primary Examiner*—Kiesha L Rose
*Assistant Examiner*—Tucker Wright
(74) *Attorney, Agent, or Firm*—Sonnenschein Nath & Rosenthal LLP

(57) ABSTRACT

A semiconductor device having a substrate that contains an insulating layer and a semiconductor layer provided on the insulating layer. The semiconductor also has an optical waveguide that is formed along a predetermined path. This optical waveguide is formed by making the semiconductor layer non-uniformed in thickness thereof. The semiconductor further has a photoreceptor having MISFET containing a floating channel body that is formed on a position of the semiconductor layer in which electric field of light guided inside the optical waveguide exists and a gate for forming channel formed on a front surface side of the channel body.

3 Claims, 22 Drawing Sheets

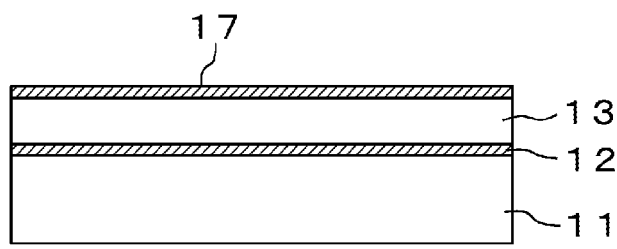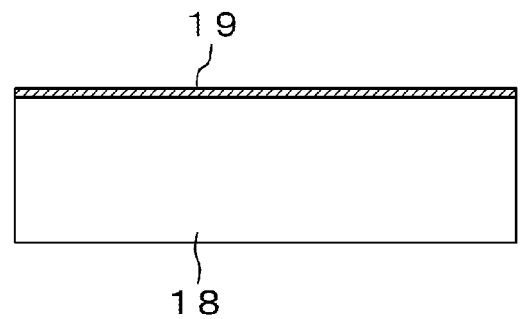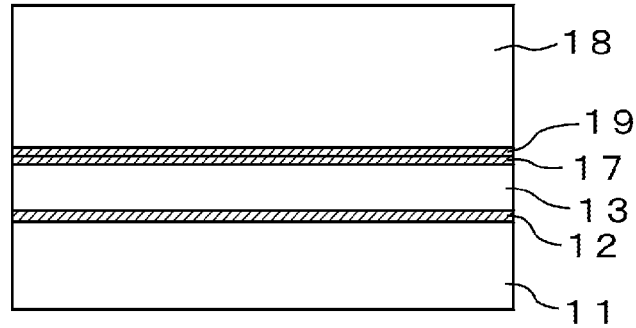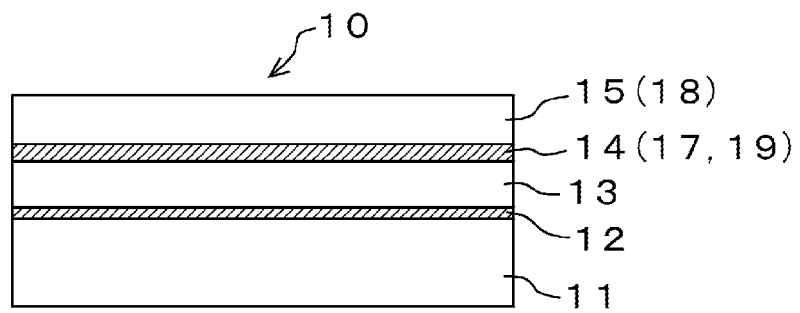

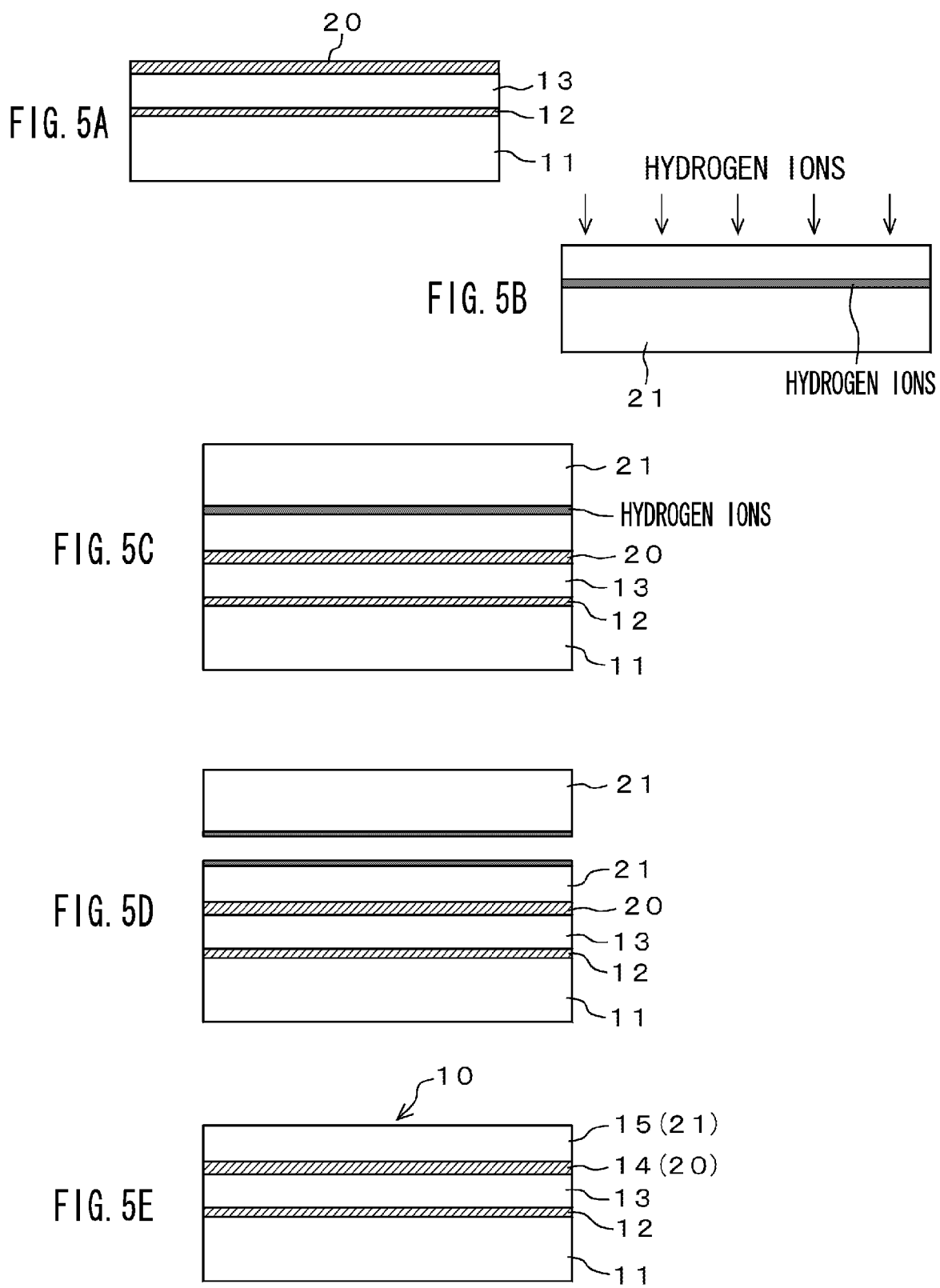

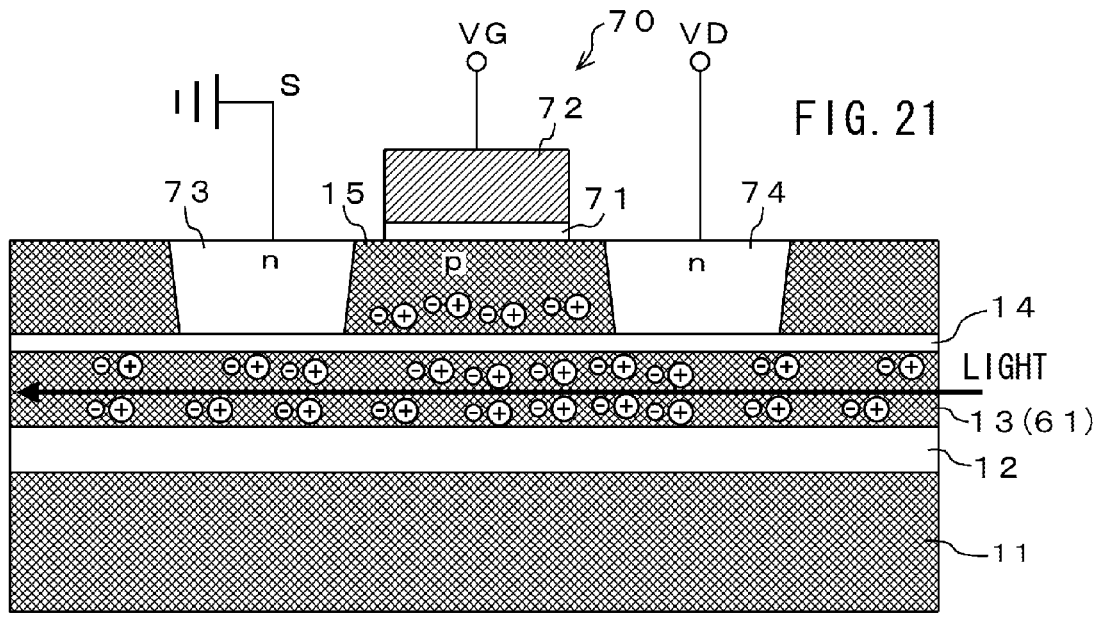
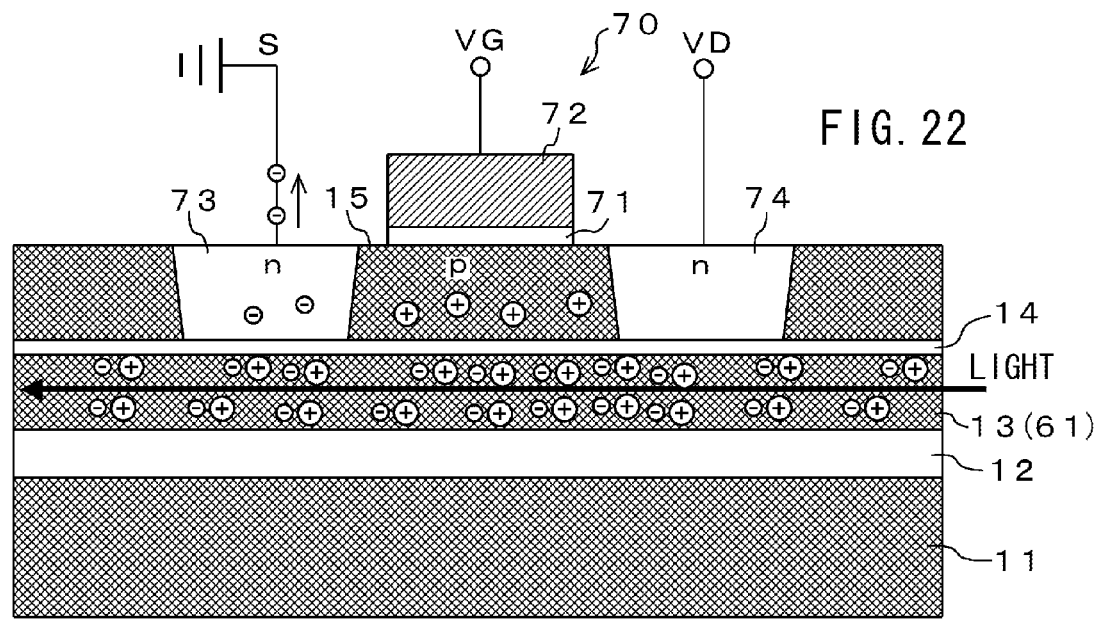

OPTICAL WAVEGUIDE AND PHOTORECEPTOR

CROSSREFERENCE TO RELATED APPLICATION

The present invention contains subject matter related to Japanese Patent Application JP 2005-339467 filed in the Japanese Patent Office on Nov. 24, 2005, the entire contents of which being incorporated herein by reference.

BACKGROUND OF THE INVENTION

1. Field of the Invention

The present invention relates to a semiconductor device having an optical waveguide for performing an optical communication, and a method of detecting light therefor.

2. Description of Related Art

An attempt such that an optical waveguide is formed on a silicon substrate to implement any optical communication capabilities has been recently noted because this enables an optical substrate and an electric substrate to be combined to one chip or an existing manufacturing line for silicon such as a manufacturing line for complementary metal-oxide semiconductor (CMOS) can be utilized, or the like.

Silicon material has transparency on light having a wavelength of 1100 nm or more. This transparency enables light having a band of 1300 nm or 1550 nm, which is used for an optical communication of main line system, to be guided into an optical waveguide, so that the silicon material has been hoped as optical communication parts for which the light having any of these wavelengths is used. In order for the silicon material to be used as the optical communication parts, various kinds of studies for wavelength filter parts, optical amplifier parts, etc. have been carried out.

If a photoreceptor is formed on the silicon substrate, it is necessary to form another material thereon because the silicon material has transparency on light having a wavelength of 1100 nm or more. Thus, a photoreceptor has been often studied in which germanium (Ge) is mainly used as light-absorbing material (see an article, "Increasing penetration of optical transmission into a case of deice: Precedence by a rooter or a portable telephone" of NIKKEI ELECTRONICS published on Jun. 6, 2005, by Tesuo NOZAWA, pages 59 through 70 and FIG. 11 thereof).

SUMMARY OF THE INVENTION

In order to form the photoreceptor employing Ge material on the silicon substrate, however, it is necessary to perform any annealing at about 900 degrees centigrade for about 12 hours at present. This is less suited for manufacturing a device at a low price.

It is desirable to develop a photoreceptor that can be manufactured by applying an existing CMOS manufacturing process thereto as it is. It is also desirable to attain at a low costs a detection of light guided in an optical waveguide that is formed on an insulating layer of the substrate using semiconductor layers thereon.

According to an embodiment of the invention, there is provided a semiconductor device having a substrate that contains an insulating layer and a semiconductor layer provided on the insulating layer. The semiconductor also has an optical waveguide that is formed along a predetermined path. This optical waveguide is formed by making the semiconductor layer non-uniformed in thickness thereof. The semiconductor further has a photoreceptor having metal insulator semiconductor field effect transistor (MISFET) containing a floating channel body that is formed on a position of the semiconductor layer in which electric field of light guided inside the optical waveguide exists and a gate for forming channel formed on a front surface side of the channel body.

In the embodiment of the invention, the substrate that contains an insulating layer and a semiconductor layer provided on the insulating layer, namely, silicon on insulator (SOI) substrate is used. By making the semiconductor layer non-uniformed in thickness along a predetermined path allows the optical waveguide to be formed along this path. The photoreceptor is formed corresponding to a predetermined position (light-receiving position) along a guide direction of this optical waveguide. This photoreceptor is constituted of MISFET containing a floating channel body that is formed on a position of the semiconductor layer in which electric field of light guided inside the optical waveguide stays and a gate for forming channel formed on a front surface of the channel body.

For example, the substrate may include a semiconductor substrate, a first insulating layer formed on the semiconductor substrate, a first semiconductor layer formed on the first insulating layer, a second insulating layer formed on the first semiconductor layer, and a second semiconductor layer formed on the second insulating layer, in this order (double-SOI substrate).

The optical waveguide is formed along the predetermined path by making the first semiconductor layer non-uniformed in thickness thereof. The channel body of the MISFET is formed by the second semiconductor layer or the first semiconductor layer.

For example, the substrate may also include a semiconductor substrate, a first insulating layer formed on the semiconductor substrate, and a first semiconductor layer formed on the first insulating layer, in this order. The optical waveguide is formed along a predetermined path by making the first semiconductor layer non-uniformed in thickness thereof and the channel body of the MISFET is formed by the first semiconductor layer.

For example, the substrate may include a semiconductor substrate, a first insulating layer formed on the semiconductor substrate, a first semiconductor layer formed on the first insulating layer, and a second insulating layer formed on the first semiconductor layer, in this order. The optical waveguide is formed along a predetermined path by making the first semiconductor layer non-uniformed in thickness thereof and the channel body of the MISFET is formed by the first semiconductor layer.

The MISFET detects carrier occurred by two photon absorption (TPA) phenomenon generated when light is guided in the optical waveguide. The MISFET can be manufactured by applying an ordinary CMOS manufacturing process thereto as it is, thereby enabling the light guided in the optical waveguide to be detected at low costs.

For example, the MISFET detects the light guided in the optical waveguide by a cycle of clearing step of removing many carriers remained in the channel body; take-in step of accumulating many carriers corresponding to the light guided in the optical waveguide onto the channel body for a set period of time, after the clearing step; and detection step of detecting the many carriers accumulated onto the channel body, after the take-in step.

If using the double-SOI substrate in which the floating channel body is formed on the first semiconductor layer constituting the optical waveguide, it is possible to increase number of carriers accumulated onto the channel body in the MISFET, as compared by a case where the floating channel body is formed on the second semiconductor layer that is separated from this first semiconductor layer by means of the second insulating layer. This allows quality of operating frequency as the photodetector to be improved.

For example, a local insulating layer that separates a region of the first semiconductor layer in which the optical waveguide stays from another region of the first semiconductor layer can be provided with the semiconductor device using the double-SOI substrate. This enables respective regions of the first semiconductor layer to be separated from each other, thereby applying most appreciate substrate biased voltage to the respective regions of the first semiconductor layer.

For example, the photoreceptor can be constituted by connecting a plurality of the MISFETs in parallel, which are arranged along a guide direction of the optical waveguide. This allows quality of operating frequency as the photodetector to be improved because total number of carriers is increased in the whole of the plural MISFETs even if less numbers of carriers are accumulated onto a channel body of one MISFET.

Thus, according to the embodiment of the invention, the light guided in the optical waveguide formed by using the semiconductor layer on the insulating layer in the substrate is detected by the photoreceptor having MISFET containing a floating channel body that is formed on a position of the semiconductor layer in which electric field of light guided inside the optical waveguide stays and which corresponds to a predetermined position along a guide direction of the optical waveguide. This enables the light guided in the optical waveguide to be detected at low costs.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIGS. 4A through 4D are diagrams each for showing a manufacturing step of the double-SOI substrate by means of lamination (polishing) method;

FIGS. 5A through 5E are diagrams each for showing a manufacturing step of the double-SOI substrate by means of lamination (Smart-cut) method;

FIG. 21 is a diagram for showing hole-storing process during light-receiving operation;

FIG. 22 is a diagram for showing hole-storing process during light-receiving operation;

DESCRIPTION OF THE PREFERRED EMBODIMENTS

Figure 1:
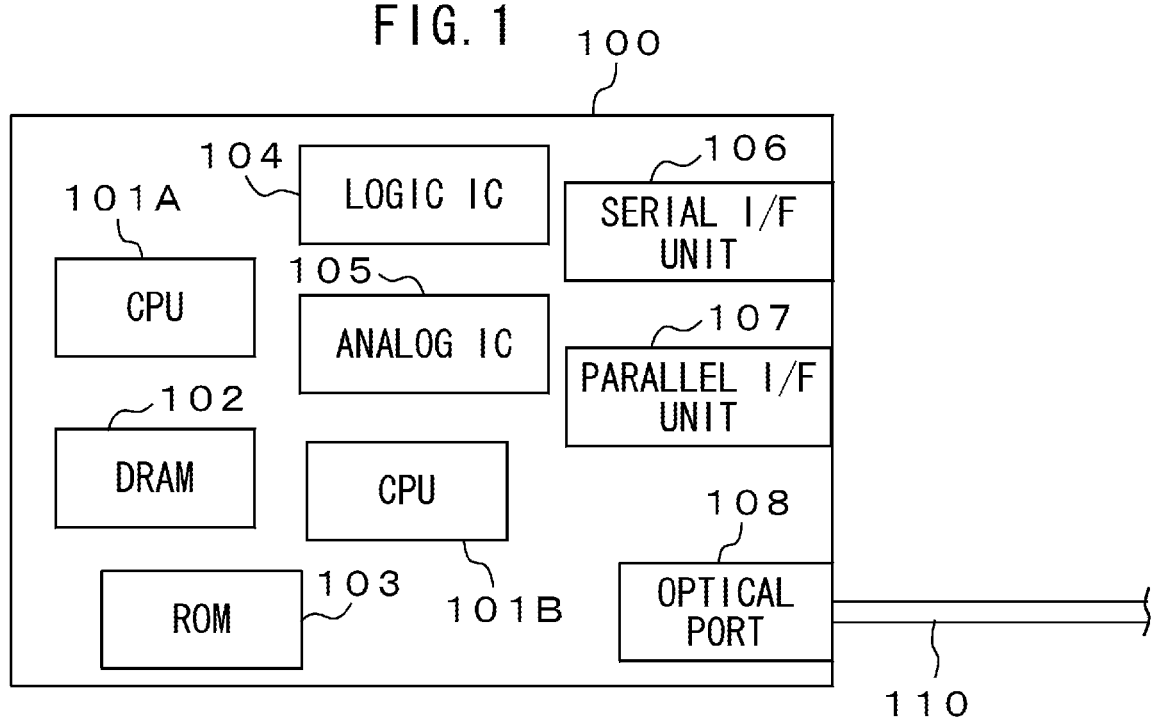
FIG. 1 is a diagram for showing an example of SOC device to which the invention is applicable.

The following will describe embodiments of a semiconductor device and a method of detecting light as preferred embodiments of the present invention with reference to drawings. FIG. 1 shows an example of system on chip (SOC) device 100 to which this invention is applicable. This SOC device 100 is a system large scale integrated (LSI) circuit constituted of two central processing units (CPUs) 101A, 101B, dynamic random access memory (DRAM) 102, read only memory (ROM) 103, logic IC 104, analog IC 105, serial I/F unit 106, parallel I/L unit 107, and an optical port. In the SOC device, the optical port 108 is connected to an optical fiber 110 to perform a communication to outside.

Figure 2:
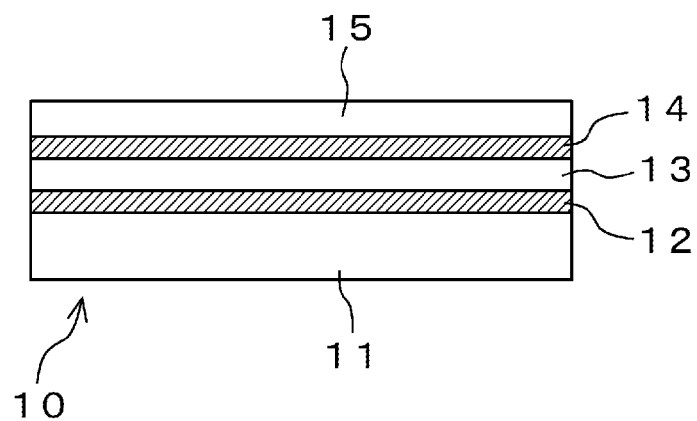
FIG. 2 is a cross-sectional view of the SOC device having double-SOI substrate structure.

This SOC device 100 is formed so as to have double-SOI substrate structure 10. FIG. 2 shows the double-SOI substrate structure 10. According to the double-SOI substrate structure 10, a silicon layer (single crystal silicon layer) 13 is formed on a silicon substrate 11 via an insulating layer 12. A silicon layer (single crystal silicon layer) 15 is formed on this silicon layer 13 via an insulating layer 14. In this case, the silicon substrate 11 constitutes a semiconductor substrate; the insulating layer 12 constitutes a first insulating layer; the silicon layer 13 constitutes a first semiconductor layer; the insulating layer 14 constitutes a second insulating layer; and the silicon layer 15 constitutes a second semiconductor layer.

Such the double-SOI substrate structure 10 can be manufactured by means of, for example, SIMOX method, lamination (polishing) method, lamination (smart-cut) method, and the like.

The following will describe manufacturing steps of the double-SOI substrate by means of SIMOX method (see FIGS. 3A through 3D).

Figure 3A:
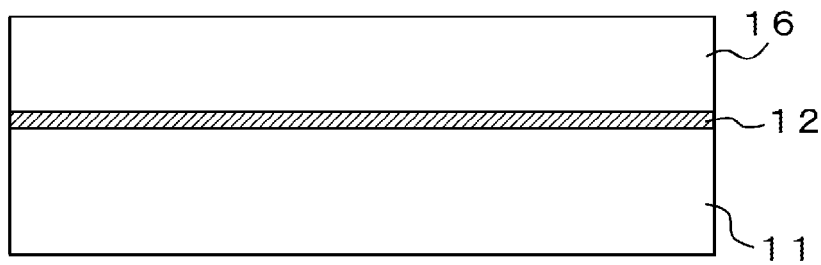
FIGS. 3A through 3D are diagrams each for showing a manufacturing step of the double-SOI substrate by means of SIMOX method.

First, an SOI substrate is prepared as shown in FIG. 3A. This SOI substrate includes the silicon substrate 11, the insulating layer 12, for example, silicon oxide layer, provided on the silicon substrate 11, and a silicon layer 16 provided on the insulating layer 12. The silicon layer 16 has such thickness that it can be required for an epitaxial growth step and the like.

Figure 3B:
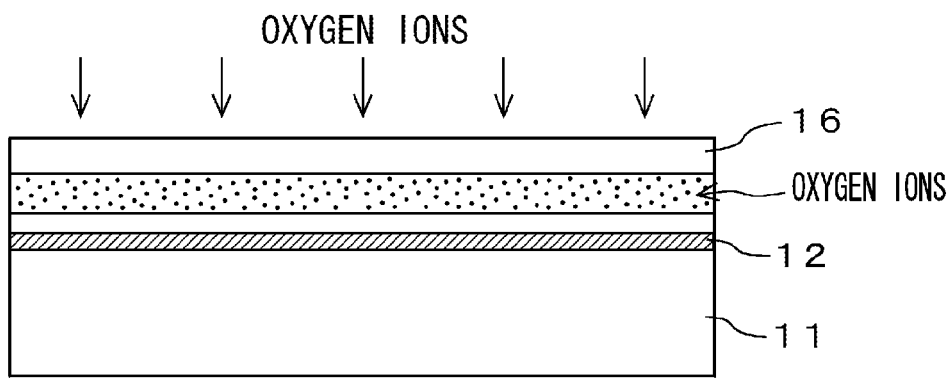

Next, as shown in FIG. 3B, oxygen ions with a high energy are implanted into a surface of the silicon layer 16 at a high concentration.

Figure 3C:
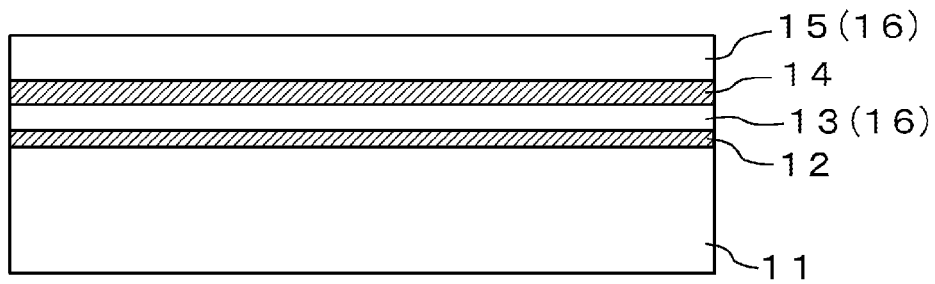

It is then annealed at a high temperature, so that the implanted oxygen ions and the silicon are reacted to produce the insulating layer 14 constituted of silicon oxide layer in the silicon layer 16, as shown in FIG. 3C.

Thus, on the silicon substrate 11, the insulating layer 12, the silicon layer 13, the insulating layer 14, and the silicon layer 15 are formed in this order to produce the double-SOI substrate structure 10.

Figure 3D:
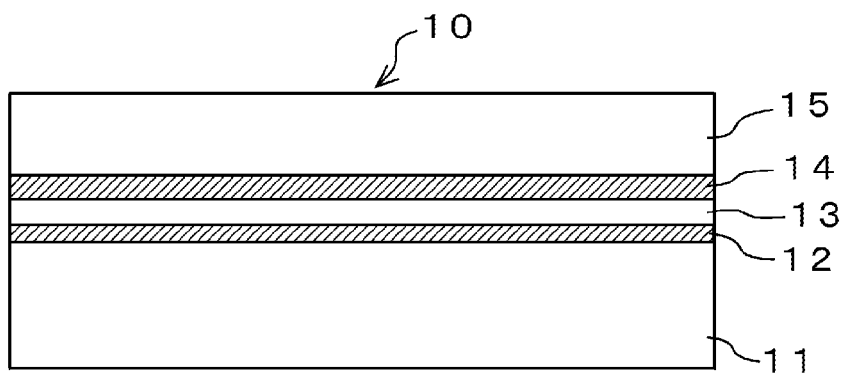

Next, as shown in FIG. 3D, thickness of the silicon layer 15 is adjusted to a desired thickness. For example, the thickness thereof can be increased by an epitaxial growth step while it can be decreased by a formation step of thermally-oxidized film and an etching step.

The following will describe manufacturing steps of the double-SOI substrate by means of lamination (polishing) method (see FIGS. 4A through 4D).

First, an SOI substrate is prepared as shown in FIG. 4A. This SOI substrate includes the silicon substrate 11, the insulating layer 12, for example, silicon oxide layer, provided on the silicon substrate 11, and a silicon layer 16 provided on the insulating layer 12. A silicon oxide layer 17 is formed on a surface of the silicon layer 13 by means of thermal oxidization. The silicon layer 13 has such thickness that it can be required for an epitaxial growth step and the like.

Alternatively, as shown in FIG. 4B, a silicon substrate 18 is prepared and a silicon oxide layer 19 is then formed on a surface of the silicon substrate 18 by means of thermal oxidization.

Next, as shown in FIG. 4C, the SOI substrate prepared in a case shown in FIG. 4A is laminated with the silicon substrate 18 prepared in a case shown in FIG. 4B. In this occasion, the silicon oxide layer 19 of the silicon substrate 18 is put over the silicon oxide layer 17 of SOI substrate and the silicon oxide layers 17 and 19 can be adhered to each other by means of hot-pressing.

Further, as shown in FIG. 4D, thickness of the silicon layer 18 on a surface side thereof is adjusted to a desired thickness by chemical mechanical polishing (CMP). Thus, on the silicon substrate 11, the insulating layer 12, the silicon layer 13, the insulating layer 14, and the silicon layer 15 are formed in this order to produce the double-SOI substrate structure 10.

The following will describe manufacturing steps of the double-SOI substrate by means of lamination (Smart-cut) method (see FIGS. 5A through 5E).

First, an SOI substrate is prepared as shown in FIG. 5A. This SOI substrate includes the silicon substrate 11, the insulating layer 12, for example, silicon oxide layer, provided on the silicon substrate 11, and a silicon layer 16 provided on the insulating layer 12. A silicon oxide layer 20 is formed on a surface of the silicon layer 13 by means of thermal oxidization. The silicon layer 13 has such thickness that it can be required for an epitaxial growth step and the like.

Alternatively, as shown in FIG. 5B, a silicon substrate 21 is prepared. Hydrogen ions are implanted into the silicon substrate 21 to set a separation position of the silicon substrate 21.

Next, as shown in FIG. 5C, the SOI substrate prepared in a case shown in FIG. 5A is laminated with the silicon substrate 21 prepared in a case shown in FIG. 5B. In this occasion, a surface of the silicon substrate 21 is put over the silicon oxide layer 20 of SOI substrate and the silicon substrate 21 and the silicon oxide layer 20 can be adhered to each other by means of hot-pressing.

Further, these laminated layers are heated up to such the temperature as to cause the silicon substrate 21 to be separated by concentration of the ion-implanted hydrogen, as shown in FIG. 5D. Thus, the silicon substrate is separated in two at the separation position thereof.

Additionally, as shown in FIG. 5E, the separated surfaces of the silicon substrate 21 are polished and finished. Thus, on the silicon substrate 11, the insulating layer 12, the silicon layer 13, the insulating layer 14, and the silicon layer 15 are formed in this order to produce the double-SOI substrate structure 10.

In stead of the silicon substrate 18 in the lamination (polishing) method or the silicon substrate 21 in the lamination (Smart-cut) method, a substrate that is composed of germanium, strained silicon, silicon-germanium, or the like can be used to produce a structure similar to the double-SOI substrate structure 10, thereby enabling such the substrate to be used in stead of the substrate having the double-SOI substrate structure 10.

In stead of the silicon layer 16 in SIMOX method, a substrate in which a semiconductor layer containing germanium, strained silicon, silicon-germanium, or the like is formed can be used. An insulating layer 14 can be then formed in this semiconductor layer to produce a structure similar to the double-SOI substrate structure 10, thereby enabling such the substrate to be used in stead of the substrate having the double-SOI substrate structure 10.

Figure 6:
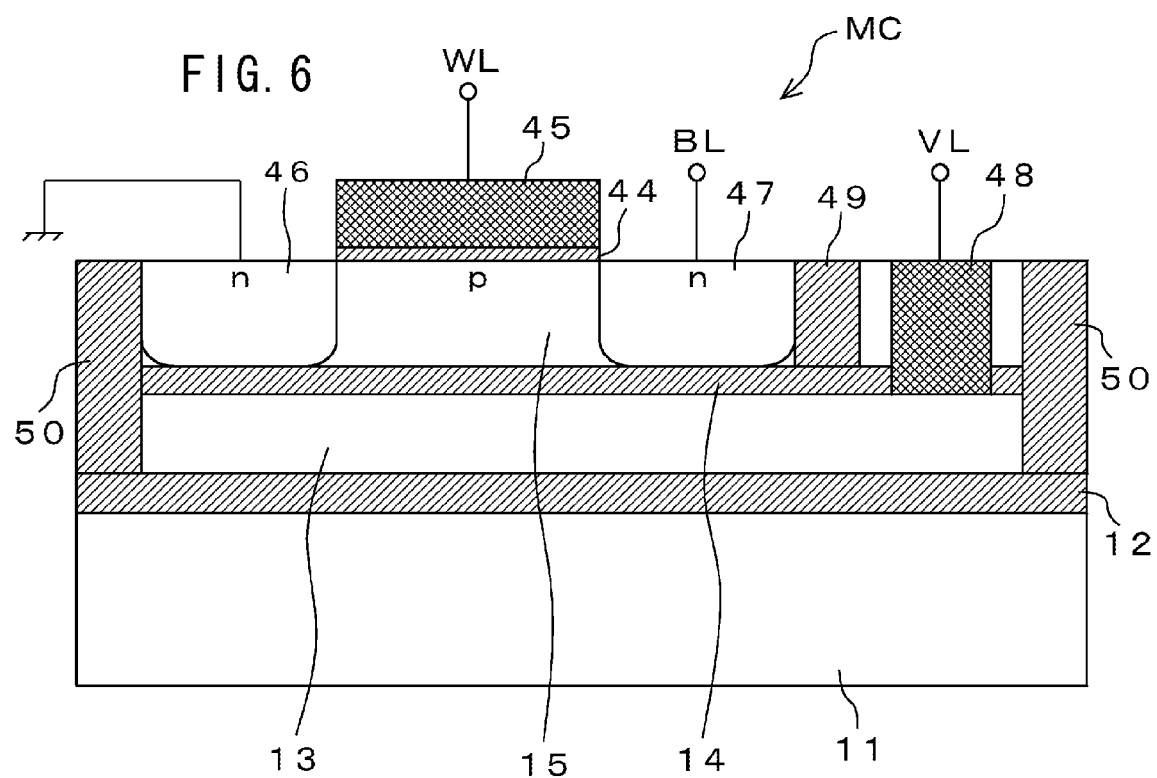
FIG. 6 is a cross-sectional view of FBC memory cell, which is a memory cell constituting DRAM, for showing a configuration thereof.

FIG. 6 shows a configuration of FBC memory cell MC constituting DRAM 102 of the above SOC device. As described above, the double SOI substrate in which on silicon substrate 11, the insulating layer 12, the silicon layer 13, the insulating layer 14, and the silicon layer 15 are formed in this order is used. The silicon layer 15 is p-type silicon layer.

The silicon layer 15 is set as a channel body and a gate electrode 45 is formed on a surface of the silicon layer 15 via gate insulating layer 44. A source diffusion layer 46 and a drain diffusion layer 47 are formed into a depth reached to the insulating layer 14. Thus, n-channel MISFET as memory cell MC is configured.

A contact plug 48 composed of polycrystalline silicon (poly-silicon) and the like is plugged into the silicon layer 13 between the insulating layers 12 and 14 with the contact plug passing through the silicon layer 15 and the insulating layer

14. This contact plug 48 is electrically connected to the silicon layer 13. This contact plug 48 is used as bias-voltage-application section for applying substrate-bias-voltage onto the silicon layer 13.

A local insulating layer 49 is also formed between the channel body and the contact plug 48 to prevent the substrate-bias-voltage from being applied from the contact plug 48 to the channel body.

Figure 7:
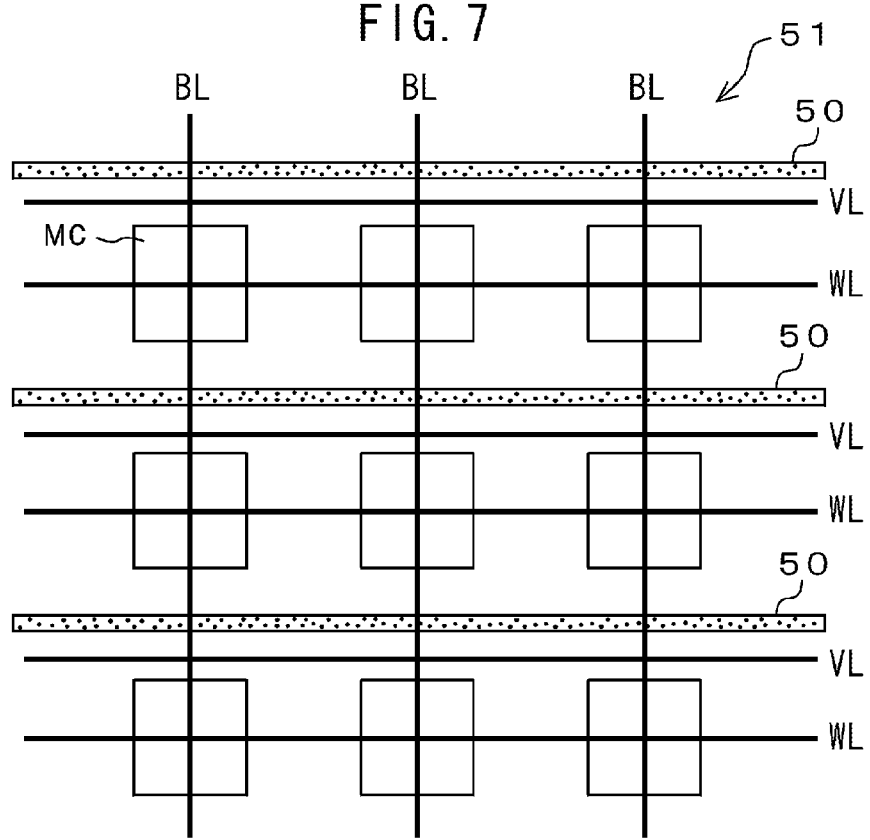
FIG. 7 is a diagram for showing a cell array in which plural FBC memory cells are arranged in a matrix.

The memory cells MC constituting DRAM 102 are respectively arranged in a matrix by their channel bodies that are floated by isolation to produce a cell array 51, as shown in FIG. 7. In this case, the drain diffusion layer 47 is connected to a bit line BL; the gate electrode 45 is connected to a word line WL; the source diffusion layer 46 is a fixed potential line SL or a ground line; and the contact plug 48 is connected to a substrate bias line VL. It is to be noted that the fixed potential line SL is omitted in the drawings.

To the silicon layer 13 corresponding to each of the memory cells MC, the substrate bias voltage is applied in units of a word line. A local insulating layer 50 extending along a direction of the word line WL are formed to separate the silicon layer 13 corresponding to each of the memory cells MC from one another in units of the word line.

Operations for writing or reading data into or from the memory cell are similar to those of well-known FBC memory cell MC(b) that are formed using an ordinary SOI substrate.

The following will describe a configuration and operations of this FBC memory cell MC(b).

Figure 8:
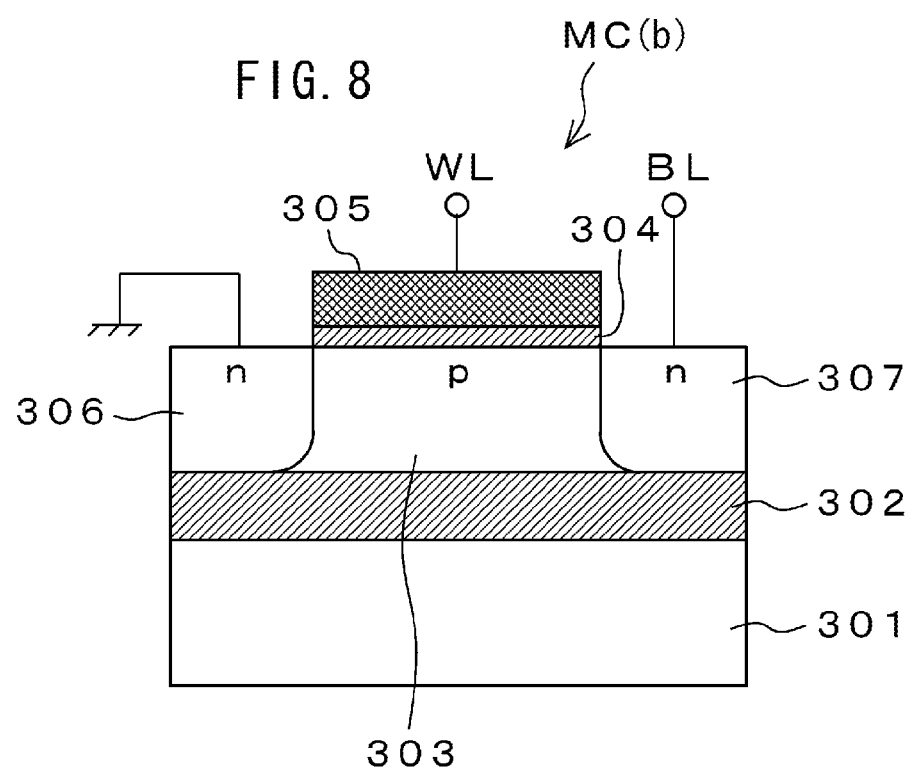
FIG. 8 is a cross-sectional view of FBC memory cell for showing a principle configuration thereof.

FIG. 8 shows a principle configuration of the FBC memory cell MC(b). In this configuration, SOI substrate in which on a silicon substrate 301, a p-type silicon layer 303 is formed via an insulating layer 302 such as a silicon oxide layer is used.

The silicon layer 303 is set as a channel body and a gate electrode 305 is formed on a surface of the silicon layer 303 via a gate insulating layer 304. A source diffusion layer 306 and a drain diffusion layer 307 are formed into a depth reached to the insulating layer 302. Thus, n-channel MISFET as memory cell MC(b) is configured.

The memory cells MC(b) are respectively arranged in a matrix by their channel bodies that are floated by isolation to produce a cell array. In this case, the drain diffusion layer 307 is connected to a bit line BL; the gate electrode 305 is connected to a word line WL; the source diffusion layer 306 is a fixed potential line or a ground line.

Operation principle of this memory cell MC(b) utilizes storage of hole that includes many carriers in the channel body (p-type silicon layer 303) of MISFET. In other words, when MISFET is operated like pentode by which a large amount of channel current flows through the drain diffusion layer 307, so that impact ionization occurs near a drain junction.

The channel body holds an excess of many carriers (holes) generated by this impact ionization, so that such a state is set as data, for example, "1" while forward current flows between the drain diffusion layer 307 and the channel body and an excess of holes held in the channel body then flows to the drain diffusion layer 307, so that such a state is set as data, "0".

Figure 9:
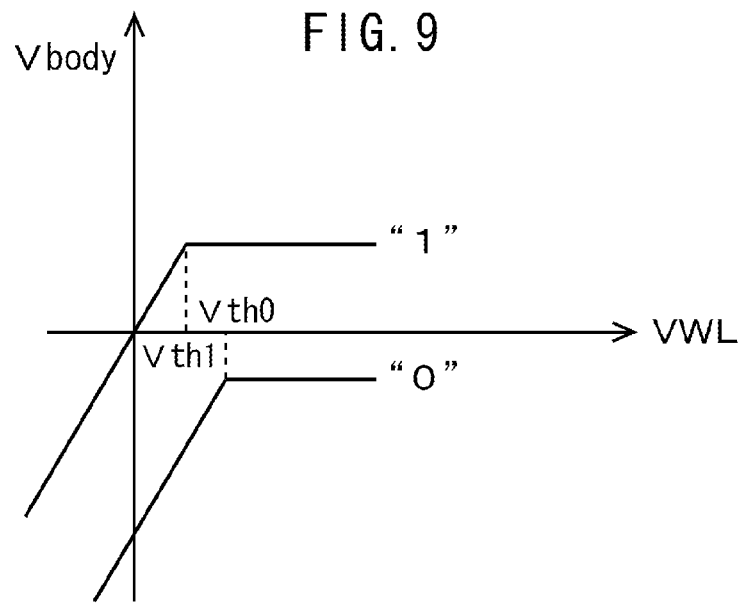
FIG. 9 is a graph for showing a relationship between body electric potential and voltage of word line.

These items of data, "0", "1" indicates difference in potential of the channel body, which are stored as any difference based on a threshold value set in the MISFET. Namely, as shown in FIG. 9, a threshold value Vth1 of the data, "1" in which potential Vbody of the channel body is high based on the hole storage is lower than a threshold value Vth0 of the data, "0" in which potential Vbody of the channel body is low.

In order to hold stable the data, "1" in which the holes are stored in the channel body, it is hopeful to hold voltage VWL to be applied to the word line WL negative. Such the data-holding state remains unchanged even if reading operation occurs unless writing operation of reverse data is accompanied. Namely, it is capable of nondestructive reading unlike DRAM having one transistor/one capacitor by which electric charge holding in the capacitor is used.

The data is basically read out of the memory cells MC(b) by means of detection of difference in conductivities of the memory cells MC(b). Since a relationship between the voltage VWL of word line and the body potential Vbody is shown in FIG. 9, if voltage that lies midway between the threshold values Vth0 and Vth1 of the data, "0" and "1" is applied to the word line WL and it is detected whether or not current flows in the memory cell, the data detection can be attained. Alternatively, if voltage that exceeds the threshold values Vth0 and Vth1 is applied to the word line WL and it is detected how much current flows in the memory cell, the data detection can be also attained.

Figure 10A:
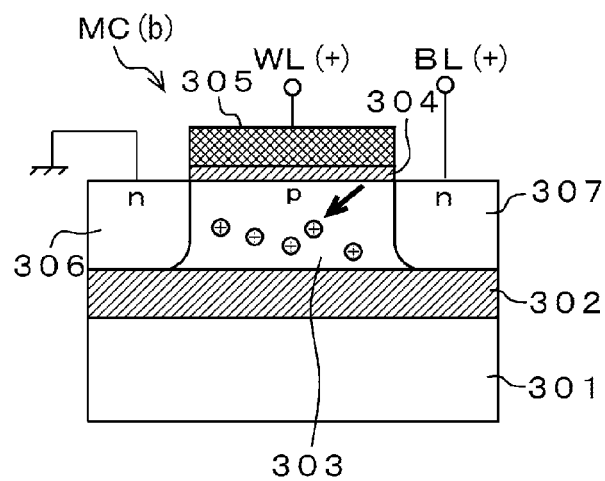
FIGS. 10A and 10B are diagrams each for showing writing operation into the FBC memory cell.
Figure 10B:
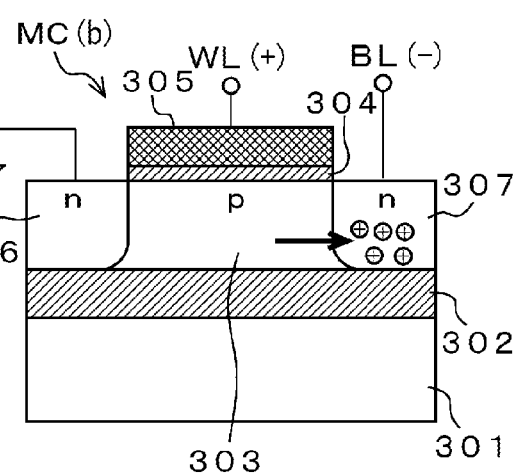

FIGS. 10A and 10B show writing operation into the memory cell MC(b). FIG. 10A shows writing operation under a condition of data, "1". High positive voltage is applied to the bit line BL (drain diffusion layer) while high positive voltage is applied to the word line WL (gate), so that impact ionization occurs near the drain junction as described above, thereby causing holes to be stored in the channel body. FIG. 10B shows writing operation under a condition of data, "0". Negative voltage is applied to the bit line BL (drain diffusion layer) while high positive voltage is applied to the word line WL (gate), so that p-n junction between the channel body (p-type silicon layer 303) and the drain diffusion layer 307 is forward-biased, thereby causing holes to be flown out of the channel body 303.

Figure 11A:
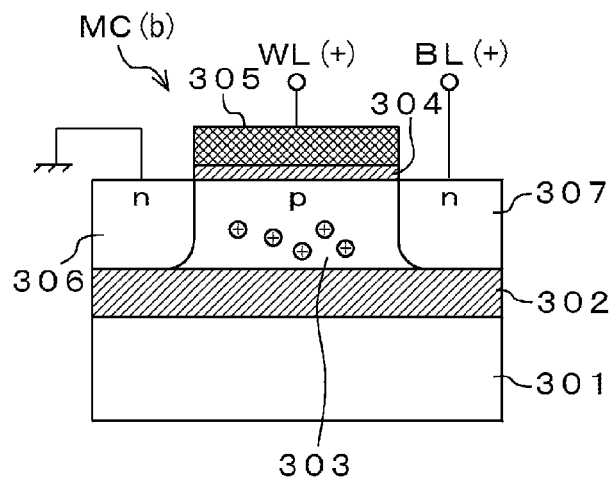
FIGS. 11A and 11B are a diagram and a graph each for showing reading operation out of the FBC memory cell.
Figure 11B:
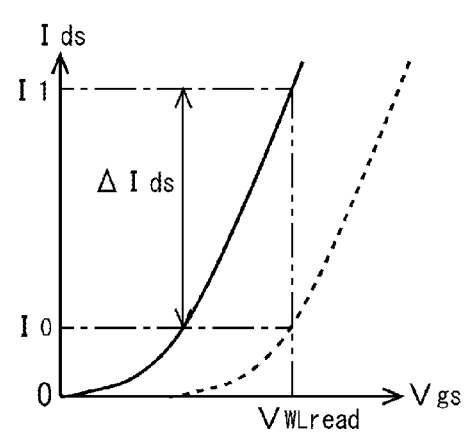

FIGS. 11A and 11B show reading operation out of the memory cell MC(b). FIG. 11A shows reading operation under conditions of data, "0" and "1". Low positive voltage is applied to the bit line BL (drain diffusion layer) while high positive voltage is applied to the word line WL (gate), thereby preventing the data from be destroyed by impact ionization. FIG. 11B shows a relationship between drain current Ids and gate voltage Vgs when reading. For example, voltage VWL-read that exceeds the threshold values Vth0, Vth1 is applied to the word line WL and sense amplifier detects difference ΔIds (=I1−I0) in drain currents corresponding to the difference in the threshold values Vth0 and Vth1, thereby allowing the data, "0" and "1" to be identified.

The following will describe substrate bias voltage to be applied to the silicon layer 13 corresponding to each of the memory cells MC that constitutes DRAM 102.

When writing no data and reading no data, the substrate bias voltage to be applied to the silicon layer 13 (voltage to be applied to the substrate bias line VL) is set to a first value, for example, −1 V, which can restrain decrease in numbers of holes, namely, carriers, stored in the channel body. This first value is a value of voltage such that it is hard to generate any phenomenon to decrease numbers of holes stored in the channel body (pass-gate leakage phenomenon) even if voltage alters at the bit line (drain diffusion layer) BL when writing or reading data of another portion.

Figure 12A:
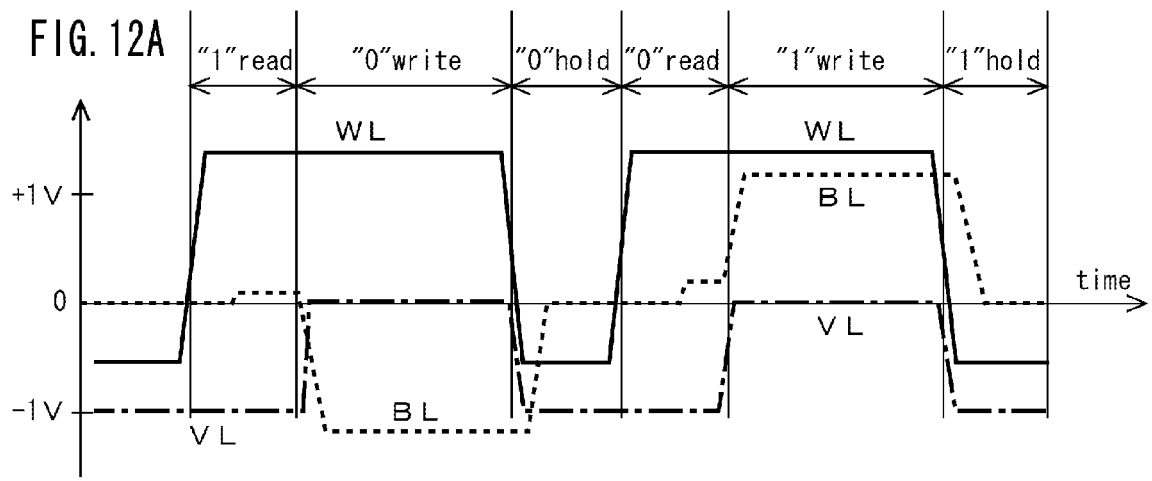
FIGS. 12A through 12C are graphs each for showing an example of setting of substrate bias voltage when writing or reading data.
Figure 12B:
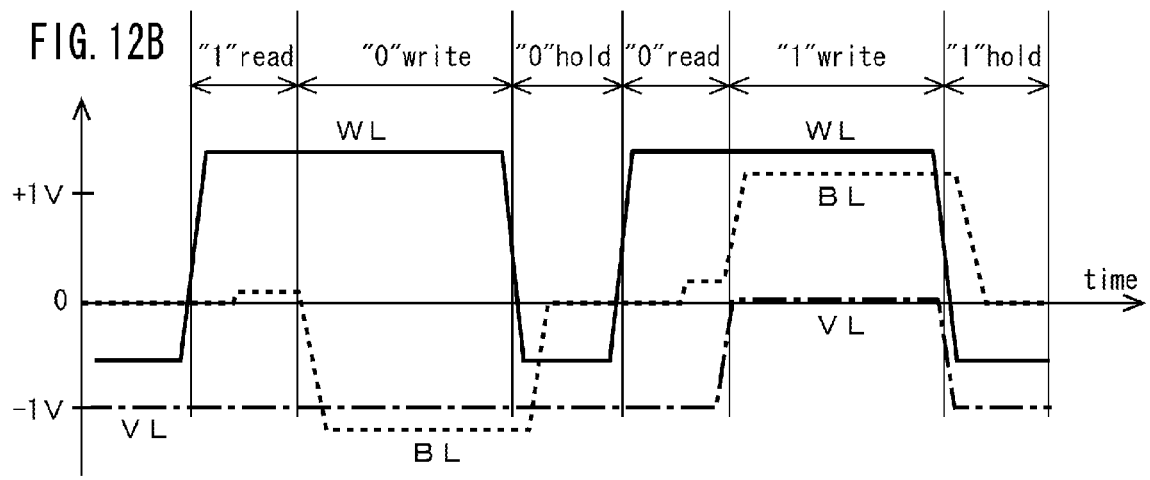
Figure 12C:
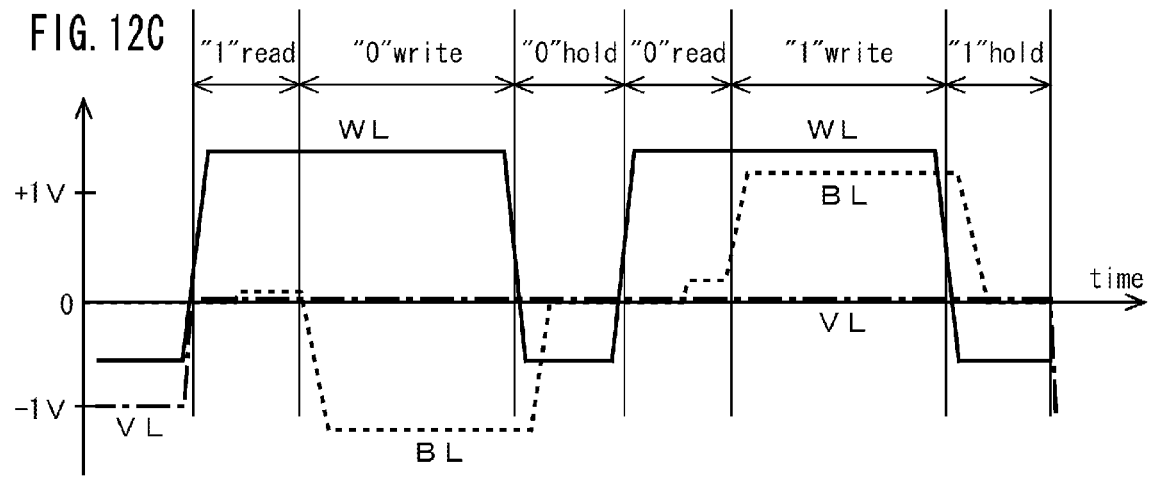

When writing data and reading data, the substrate bias voltage to be applied to the silicon layer 13 is set to any one of the following three options (1), (2), and (3):

(1) When writing items of data, "1" and "0", as shown in FIG. 12A, the substrate bias voltage to be applied to the silicon layer 13 is set to a second value, for example, 0 V, that is suitable for writing;

(2) When writing data, "1", as shown in FIG. 12B, the substrate bias voltage to be applied to the silicon layer 13 is set to a second value, for example, 0 V, that is suitable for writing;

(3) When writing and reading data, as shown in FIG. 12C, the substrate bias voltage to be applied to the silicon layer 13 is set to a second value, for example, 0 V, that is suitable for writing.

On these options (1) and (2), the substrate bias voltage is set to the first value, for example 0 V, which can restrain decrease in numbers of holes stored in the channel body except for a period of time when writing items of data, "1" and "0" or when writing data, "1". This permits any pass-gate leakage phenomenon to be harder to occur even if voltage alters at bit line BL (drain diffusion layer), as compared with a case where the substrate bias voltage is set to the second value.

Further, on these options (1) and (2), when writing items of data, "1" and "0" or when writing data, "1", the substrate bias voltage is set to the second value that is suitable for writing. This enables voltage of the bit line BL when writing data to be set lower, thereby allowing any pass-gate leakage phenomenon to be harder to occur at a location connecting to the word line WL, where data is prohibited from being written.

On the option (3), as compared with the options (1) and (2), a long period of time when the substrate bias voltage is not held to a value which can keep numbers of holes stored in the channel body is lapsed. According to the option (3), however, it is possible to set a changeover frequency of the substrate bias voltage to strikingly low one, as compared with the options (1) and (2).

It is assumed that the insulating layer 14 is formed by means of SIMOX method or lamination method so that the insulating layer can be generally formed thicker than the gate oxide layer 44 is formed, this option (3) is seemed to be application method of substrate bias voltage that is suitable for implementing a high speed record-and-reproduction.

Figure 13:
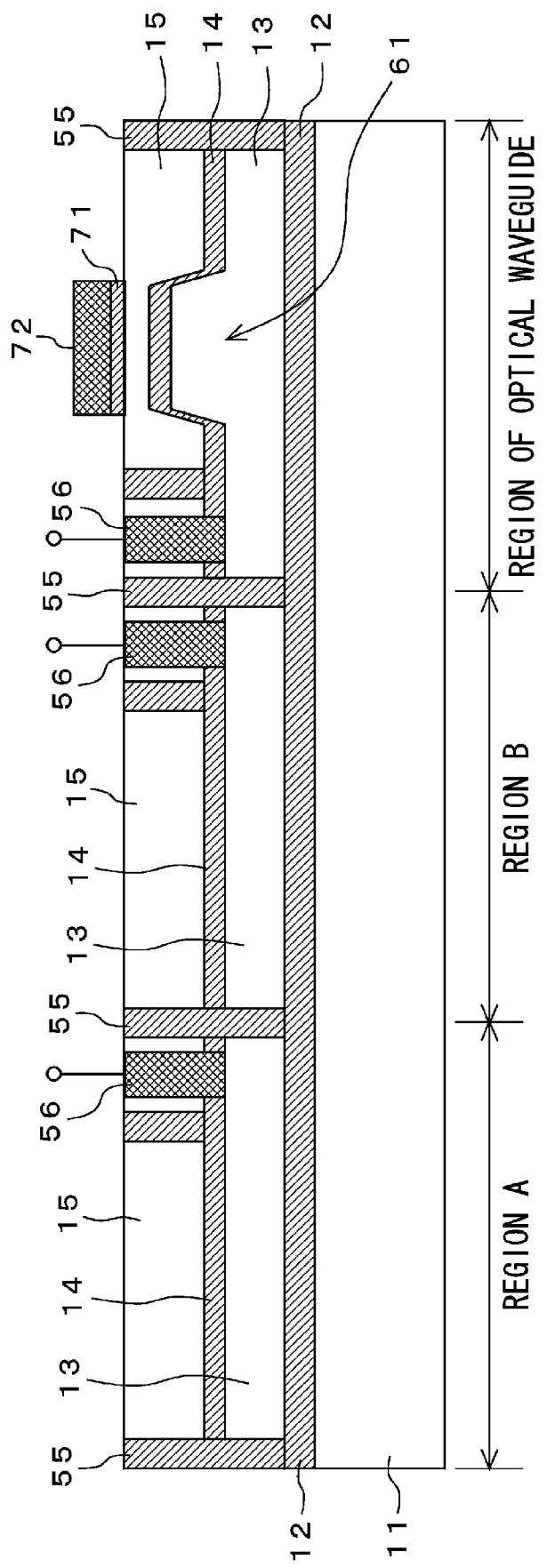
FIG. 13 is a diagram for showing separation of regions and region of optical waveguide in order to apply the different substrate bias voltages thereto.
Figure 14:
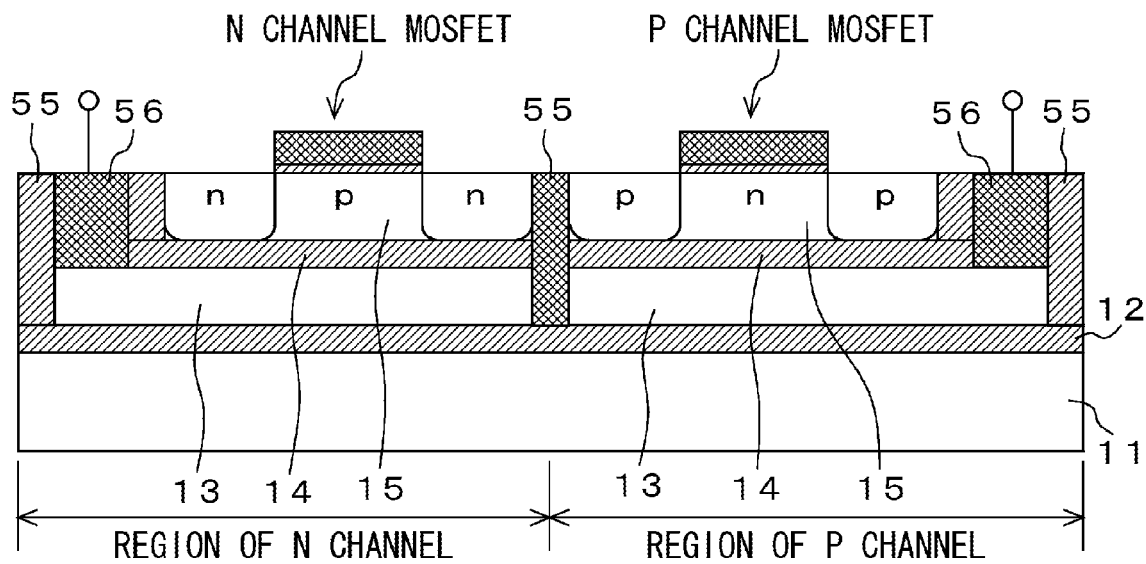
FIG. 14 is a diagram for showing separation of regions in order to apply the different substrate bias voltages thereto.

In the SOC device 100 shown in FIG. 1, a local insulating layer 55 for separating the silicon layer 13 one from another is provided between the regions in the silicon layer 13, to which different substrate bias voltages are to be applied. FIG. 13 shows regions A and B and region of optical waveguide, which will be described. FIG. 14 shows regions of N channel and P channel.

In these cases, a local insulating layer 55 for separating the silicon layer 13 one from another is provided between the respective regions. Through a contact plug 56 that is formed similar to the contact plug 48 in the memory region, predetermined substrate bias voltage can be applied to each of the regions. This enables most suitable substrate bias voltage to be applied to each of the regions of silicon layer 13, thereby allowing the highest performance to be attained in the SOC device 100.

Figure 15:
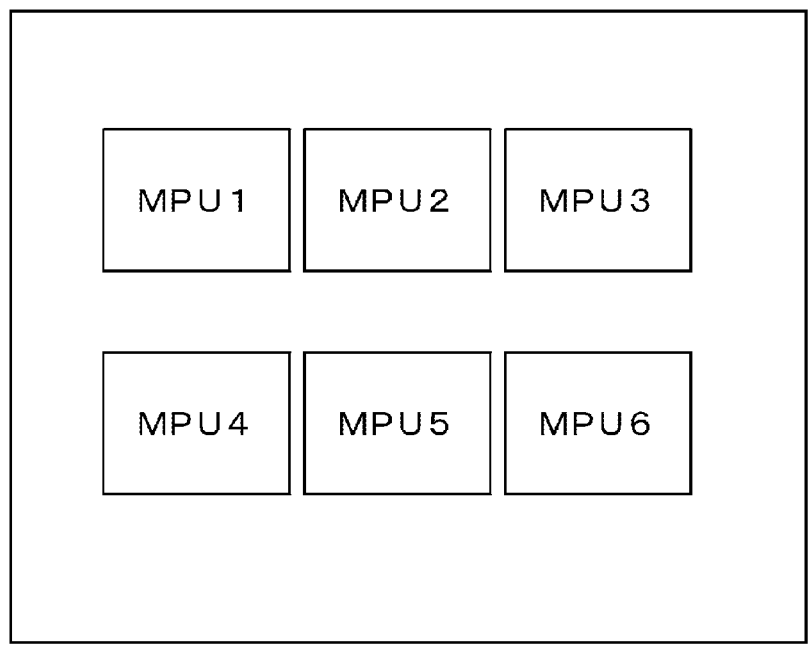
FIG. 15 is a diagram for showing multi-processor IC.

It is to be noted that although the SOC device 100 shown in FIG. 1 has been provided with two CPUs, 101A, 101B, the invention is not limited thereto. For example, as shown in FIG. 15, multi-processor IC having six processors, MPU1 through MPU6 is conceivable. In this IC, all of the processors are not active (set on) anytime. For example, specially when one high definition (HD) image is simply decoded, IC is active but all of the processors therein are not active.

In this case, if active processors are illustratively the processors MPU1 and MPU2, substrate bias voltage that is most suitable when operating can be applied to regions of these processors MPU1 and MPU2 whereas substrate bias voltage that is most suitable when waiting can be applied to regions of other processors MPU3 through MPU6.

Further, in the SOC device 100 shown in FIG. 1, optical communication can be performed between, for example, CPU 101A and CPU 101B using an optical waveguide. In this embodiment, as shown in FIG. 13, the optical waveguide 61 for optical communication is constituted of the insulating layer 12, the silicon layer 13, and the insulating layer 14. In this embodiment, uneven portion of the silicon layer 13 as the optical waveguide 61 is formed in the silicon layer 13 sandwiched between the insulating layers 12, 14. Silicon (Si) has refractive index of 3.5 and silicon dioxide (SiO$_2$) has refractive index of 1.5, so that the optical waveguide 61 can be constituted of the insulating layer 12, the silicon layer 13, and the insulating layer 14.

The following will describe manufacturing steps of the optical waveguide 61 in a case where it is manufactured according to SIMOX method with reference to FIG. 16. In FIG. 16, like reference characters refer to like elements shown in FIG. 3, detailed explanation of which will be omitted.

Figure 16A:
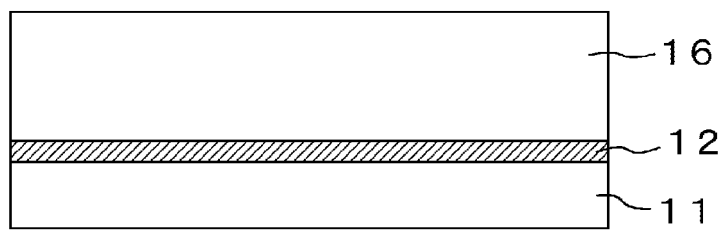
FIGS. 16A through 16E diagrams each for showing a manufacturing step of optical waveguide according to SIMOX method.

First, an SOI substrate is prepared as shown in FIG. 16A. This SOI substrate includes the silicon substrate 11, the insulating layer 12, for example, silicon oxide layer, provided on the silicon substrate 11, and a silicon layer 16 provided on the insulating layer 12. The silicon layer 16 has such thickness that it can be required for an epitaxial growth step and the like.

Figure 16B:
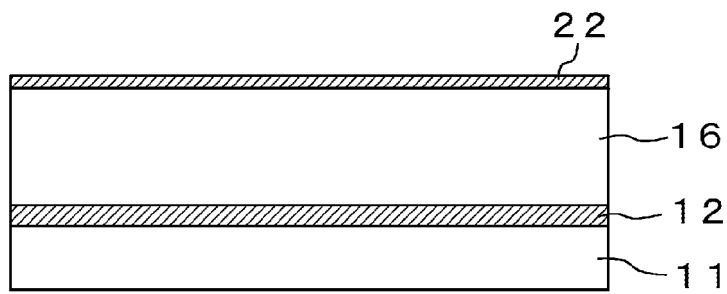
Figure 16C:
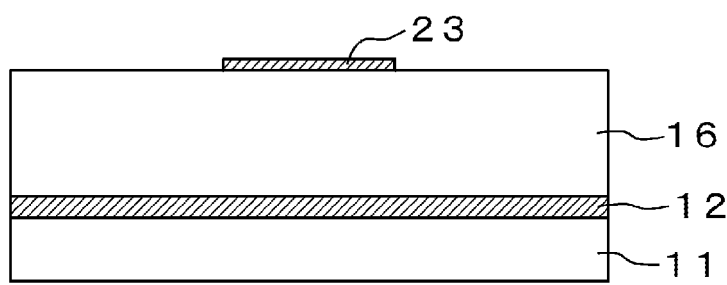

Next, as shown in FIG. 16B, a silicon oxide layer 22 is formed on a surface of the silicon layer 16 by means of thermal oxidization. Any pattering is performed on the silicon oxide layer 22, so that a mask 23 of silicon dioxide corresponding to the optical waveguide 61 can be formed, as shown in FIG. 16C.

Figure 16D:
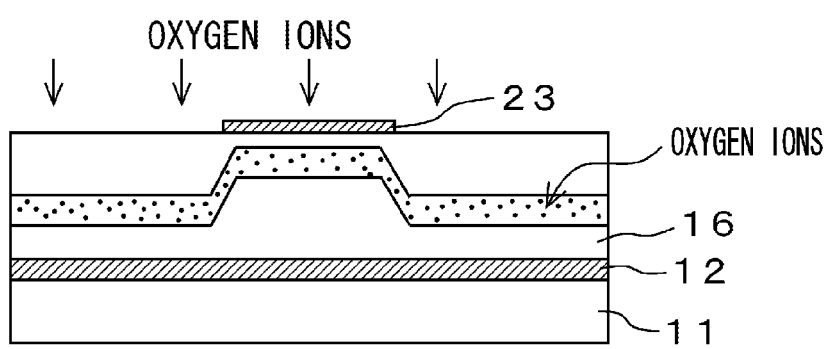

Next, as shown in FIG. 16D, oxygen ions are implanted into a surface of the silicon layer 16 with the mask 23 being positioned thereon. In this moment, at a location on which the mask 23 is positioned, the mask 23 decreases a speed of oxygen ion, thereby implementing the oxygen ions shallower whereas at a location on which no mask is positioned, the mask 23 does not decrease a speed of oxygen ion, thereby implementing the oxygen ions deeper.

Figure 16E:
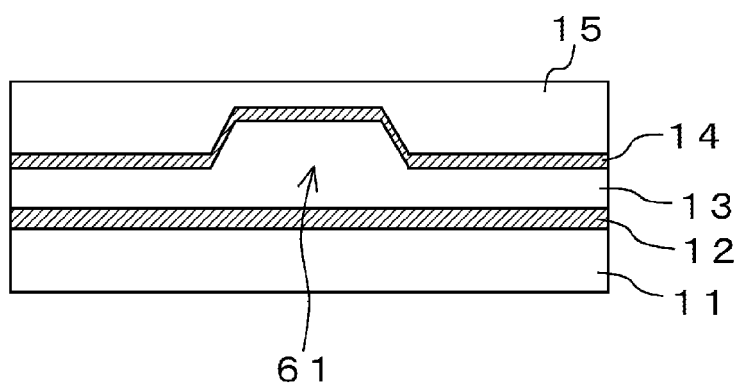

As shown in FIG. 16E, SOI substrate, to the silicon layer 16 of which oxygen ions are implemented, is then annealed at a high temperature, so that the implanted oxygen ions and the silicon are reacted to produce the silicon oxide layer (insulating layer) 14 in the silicon layer 16.

Thus, the insulating layer (silicon oxide layer) 12, the silicon layer 13, and the insulating layer (silicon oxide layer) 14 are formed in this order to produce the optical waveguide 61. It is to be noted that the mask 23 is removed therefrom after or before annealing or after a certain degree of annealing is carried out.

Figure 17:
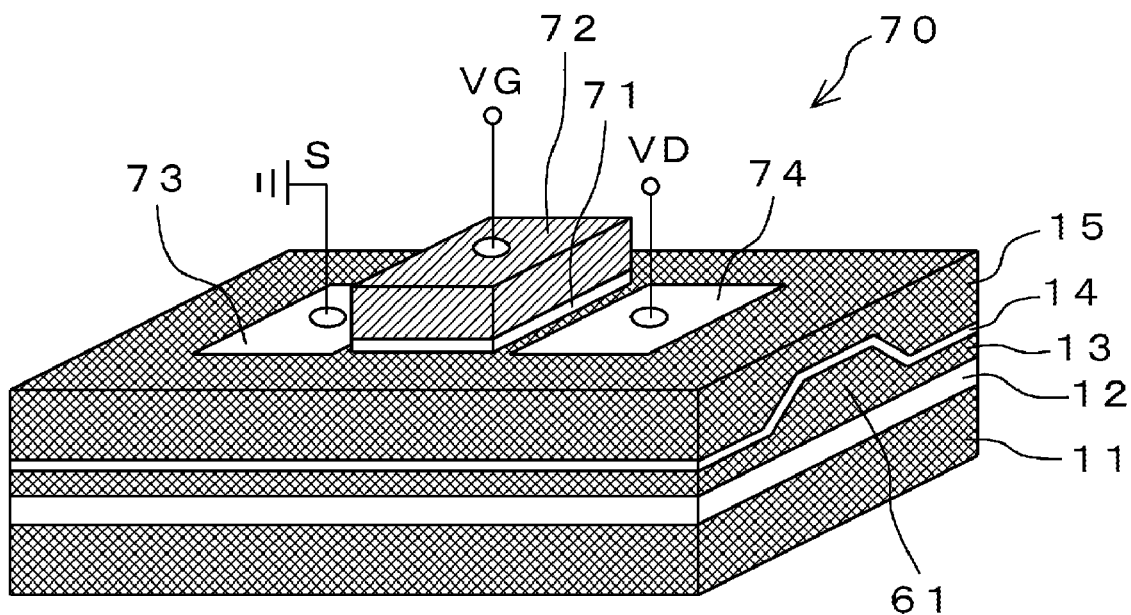
FIG. 17 is a perspective view of photoreceptor for showing a whole configuration thereof.
Figure 18:
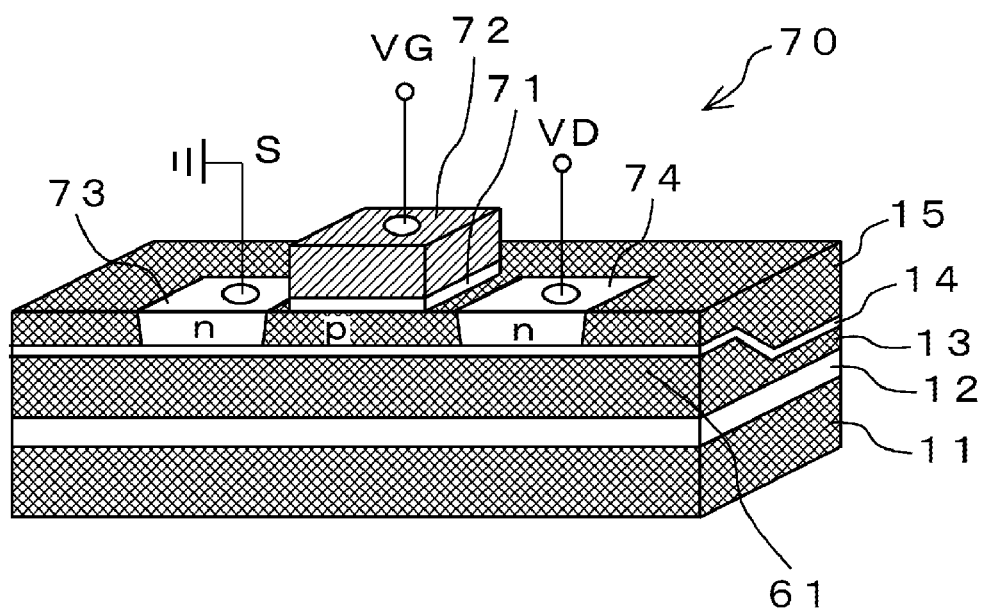
FIG. 18 is a cross-sectional view of the photoreceptor for showing an internal configuration thereof.

The SOC device 100 shown in FIG. 1 is also provided with a photoreceptor 70 for detecting an optical signal guided through the above-mentioned optical waveguide 61. FIGS. 17 and 18 show a configuration of the photoreceptor 70. FIG. 17 shows a whole configuration thereof and FIG. 18 shows a cross section thereof.

This photoreceptor 70 has MOS transistor (PDSOI transistor) as MISFET, which is set on a location corresponding to a predetermined location of the optical waveguide 61. In this case, p-type silicon layer 15 is set as channel body and on a surface thereof, a gate electrode 72 is formed via a gate insulating layer 71. A source diffusion layer 43 and a drain diffusion layer 74 are also formed toward a depth reached to the insulating layer 14. Thus, PDSOI transistor is configured.

An ordinary photoreceptor operates based on a principle of detecting current generated by reception of photon and thus, can perform consecutive measure of an amount of light. A principle of receiving light in the photoreceptor 70 is based on detection whether or not TPA phenomenon generated by light-guiding just before the detection occurs. The amount of light is not consecutively monitored in the photoreceptor 70 and a cycle of this measurement is almost two cycles of MOS transistor, thereby enabling high-speed MOS device to be manufactured and very rapid response detection of the amount of light to be implemented.

When the optical waveguide 611 guides light, a large amount of light (evanescent light) propagating into a portion upon this optical waveguide 61 is present therein. This causes electric field of light guided in the optical waveguide 61 to be existed in the channel body of the PDSOI transistor constituting the photoreceptor 70. In the photoreceptor 70, TPA phenomenon generated by this propagating light is utilized.

Figure 19:
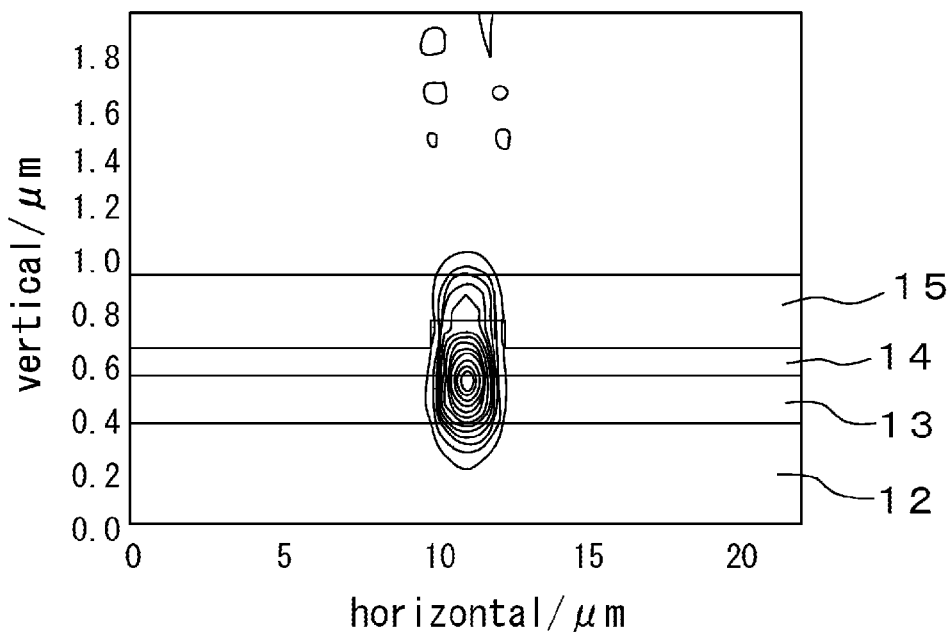
FIG. 19 is a diagram for showing a distribution of electric field strength for light.
Figure 20:
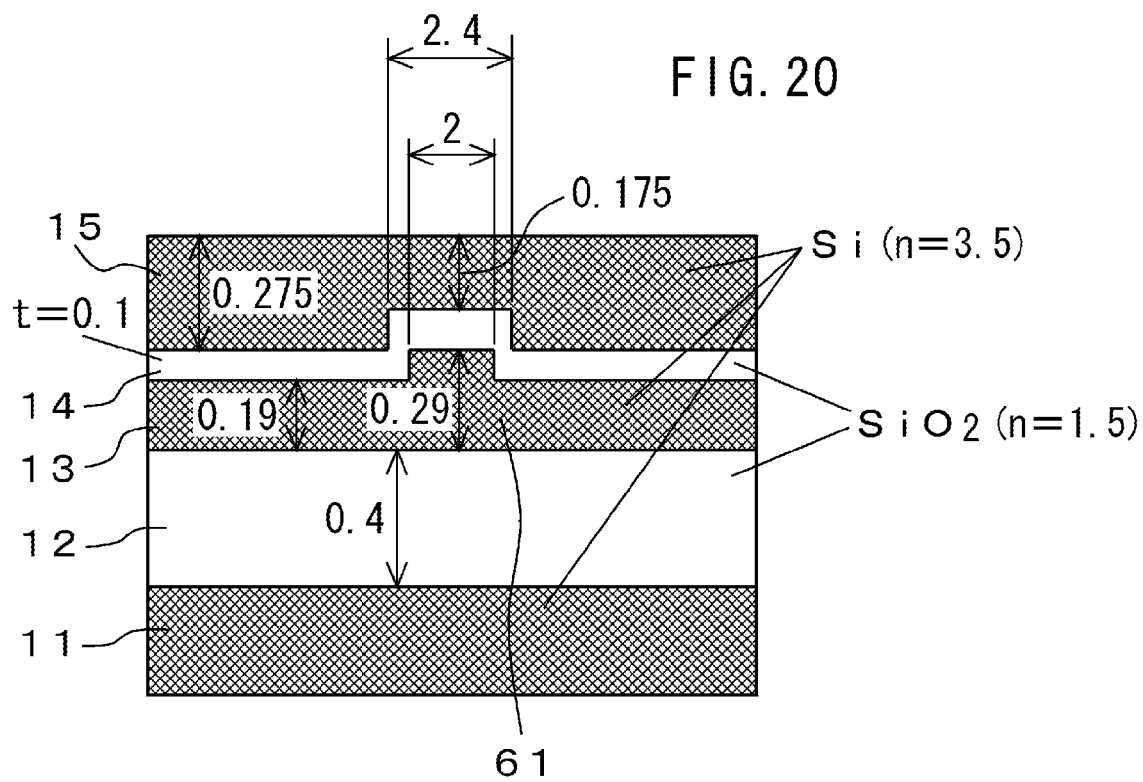
FIG. 20 is a diagram for showing manufacturing steps of optical waveguide.

FIG. 19 shows, in the optical waveguide 61 formed in a size shown in FIG. 20, a distribution of electric field strength for light having a wavelength of 1.55 μm that is guided in the optical waveguide 61. As clearly shown in FIG. 19, it is seen that a large amount of light (evanescent light) propagating into a portion upon this optical waveguide 61 is present therein. It is to be noted that a unit of size of each of layers shown in FIG. 20 is μm.

The following will describe a principle of receiving light in the photoreceptor 70.

As described above, the photoreceptor 70 is based on detection whether or not TPA phenomenon generated by light-guiding in the optical waveguide 61 just before the detection occurs. This occurrence of TPA phenomenon is detected on the basis of existence or nonexistence of the hole stored in the channel body.

The following will describe process in which holes are stored in the channel body of the PDSOI transistor, namely, the photoreceptor 70 based on TPA phenomenon of light guided in the optical waveguide 61 with reference to FIGS. 21, 22.

First, as shown in FIG. 21, a pair of electron and hole is formed by TPA phenomenon at a region in which there is an electric field of light. At first, electrons and holes exist equal in number. Since traveling speed of electron has several times as rapid as that of the hole and thus, the electron can be easily traveled as compared with the hole, the electron is rapidly and easily reached to the source diffusion layer 73 and the hole remains in the channel body.

Figure 23:
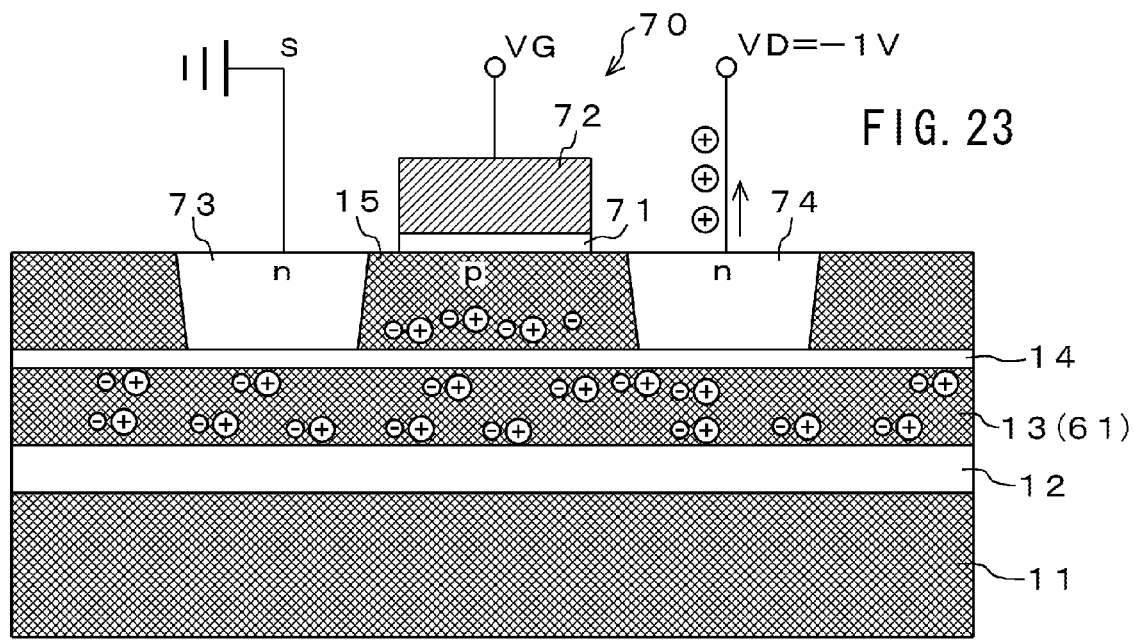
FIG. 23 is a diagram for showing a clearing step during light-receiving operation.
Figure 24:
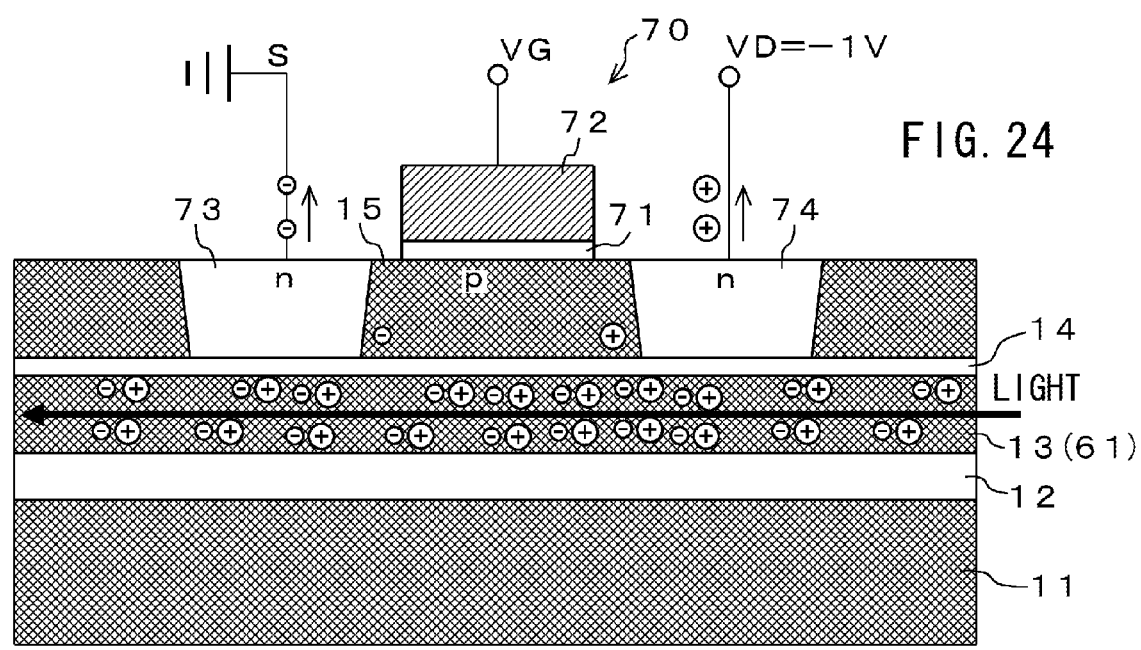
FIG. 24 is a diagram for showing a clearing step during light-receiving operation.

The following will describe clearing step performed just before the light-detecting steps with reference to FIGS. 23 and 24.

The photoreceptor 70 detects the hole remained in the channel body of the PDSOI transistor, as described above, and it is necessary to provide a step (hereinafter, referred to as "clearing step) for removing the hole that may remain in the channel body just before the light-detecting steps are performed.

In order to remove the hole from the channel body in the clearing step, drain voltage VD of PDSOI transistor is set to negative voltage, for example, −1 V, so that forward p-n junction occurs therein and the hole remained in the channel body is then forcibly traveled to the drain diffusion layer 74.

FIG. 23 shows the clearing step when no light is guided in the optical waveguide 13 (61). In this case, almost holes remained in the channel body can be perfectly removed. FIG. 24 shows the clearing step when light is guided in the optical waveguide 13 (61), namely, TPA phenomenon occurs. In this case, TPA phenomenon generates carriers one after another in the channel body but almost electrons can be traveled to the source diffusion layer and almost holes can be traveled to the drain diffusion layer.

Figure 25:
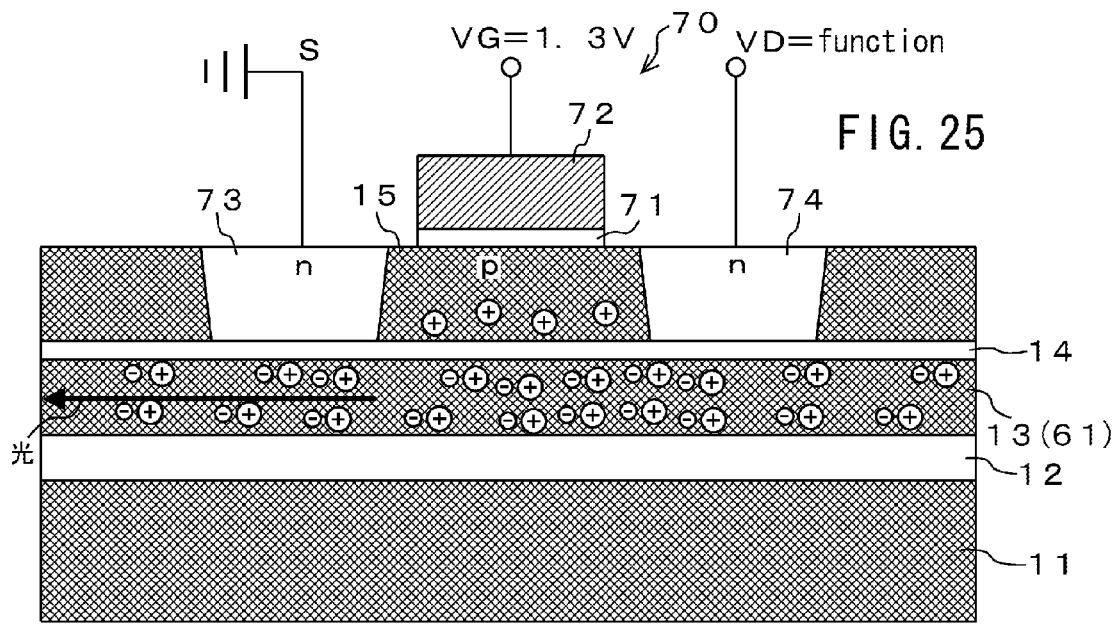
FIG. 25 is a diagram for showing light-detecting steps during light-receiving operation.
Figure 26:
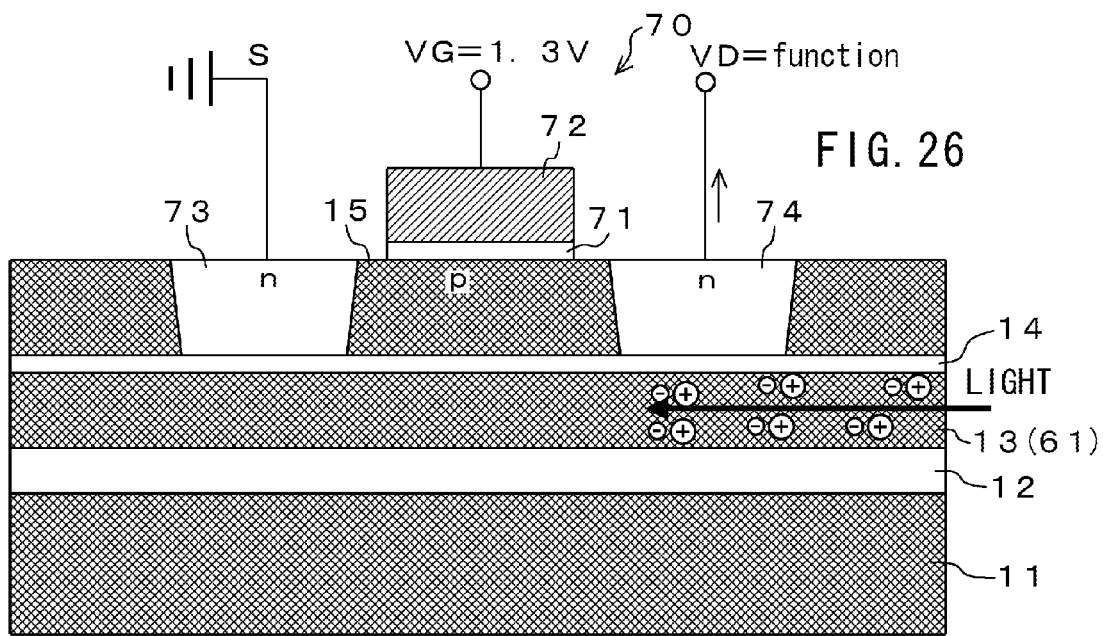
FIG. 26 is a diagram for showing light-detecting steps during light-receiving operation.

The following will describe light-detecting steps with reference to FIGS. 25 and 26. The photoreceptor 70 does not determine whether light is guided in the optical waveguide 61 at a detection period of time, but determines whether a period of time when light is guided during a period of time starting from a finish of the above clearing step to a detection time is long or not.

FIG. 25 shows an example of a case where a period of time when light is guided during a period of time starting from a finish of the above clearing step to a detection time is long. In this example, at the detection time, the holes generated by means of TPA phenomenon during a period of time starting from a finish of the above clearing step to the detection time remain in the channel body of PDSOI transistor that is the photoreceptor 70. It is determined therefrom that the period of time when light is guided during a period of time starting from a finish of the above clearing step to a detection time is long.

In order to determine whether or not the holes remain in the channel body, gate voltage VG is set to positive voltage, for example, 1.3 V. When voltage is being gradually applied to the drain diffusion layer 74, change in drain current is detected, thereby determining whether or not the holes remain in the channel body. This equals to reproduction principle in the above FBC memory cell.

FIG. 26 shows an example of a case where a period of time when light is guided during a period of time starting from a finish of the above clearing step to a detection time is very short. In this example, at the detection time, almost holes generated by means of TPA phenomenon during a period of time starting from a finish of the above clearing step to the detection time not remain in the channel body of PDSOI transistor that is the photoreceptor 70. It is determined therefrom that the period of time when light is guided during a period of time starting from a finish of the above clearing step to a detection time is very short.

Figure 27:
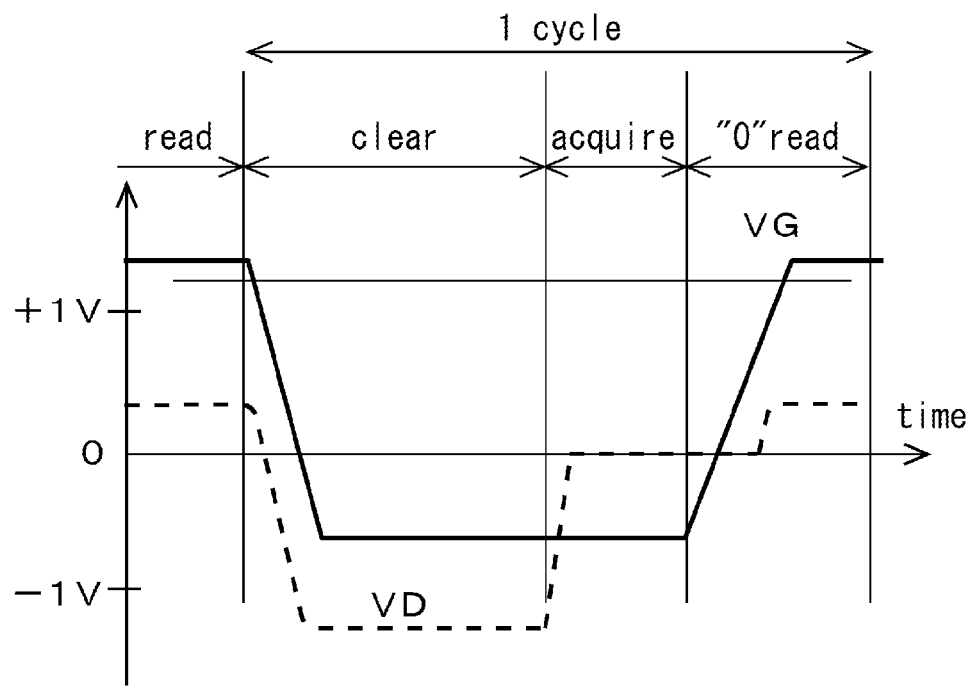
FIG. 27 is a graph for showing operation timing of photoreceptor.
Figure 28:
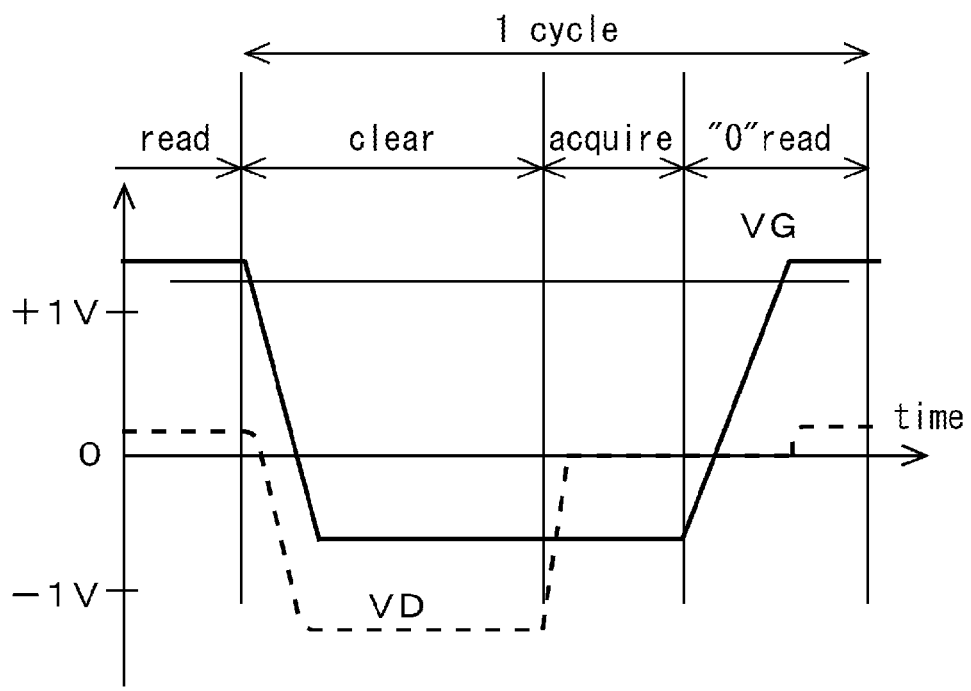
FIG. 28 is a graph for showing operation timing of photoreceptor.

The following will describe operation timings of the photoreceptor (PDSOI transistor) 70 with reference to FIGS. 27 and 28. FIG. 27 shows an example of drain current if no hole remain in the channel body by avoiding light being guided in the optical waveguide 61 during a period of acquiring time after a finish of the clearing step. FIG. 28 shows an example of drain current if the hole remains in the channel body by guiding light in the optical waveguide 61 during a period of acquiring time after a finish of the clearing step.

As shown in FIGS. 27 and 28, operations of the photoreceptor 70 include three steps constituted of clearing step, acquiring step and reading step. Such the few steps of three steps can cause its operation frequency to be reduced to a frequency that is smaller than response frequency of PDSOI transistor (MOS transistor) incomparably. This means less deterioration in frequency. If PDSOI transistor has operation frequency of about 10 G Hz, this transistor can have operation frequency of an order of some G Hz.

Although it is necessary that numbers of the holes increases to enhance an accuracy of detection in order to improve performance relative to operation frequency, when numbers of the holes increases by extending a period of data-acquiring time, repeat rate of cycles decreases, which does not improve performance relative to operation frequency. Further, even when numbers of the holes increases by increasing a space between gates to expand the channel body, operation frequency of PDSOI transistor deteriorates. This shortens a period of data-acquiring time, but does not shorten a period of cycle.

Figure 29:
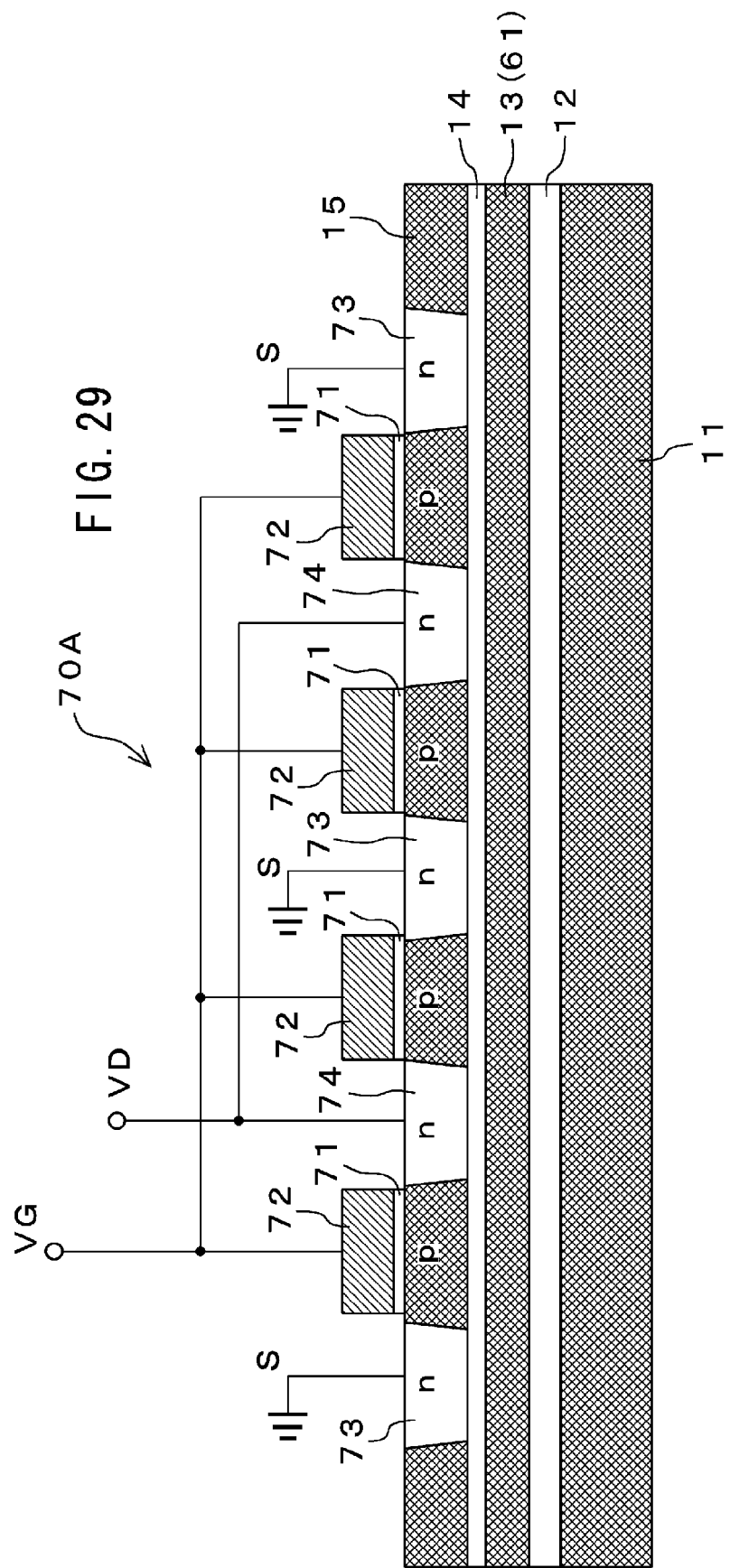
FIG. 29 is a cross-sectional view of another embodiment of photoreceptor for showing a configuration thereof.

FIG. 29 shows an example of improvement of performance relative to operation frequency as the photodetector. FIG. 29 shows a photoreceptor 70A that is capable of shortening a period of data-acquiring time and increasing an amount of signal as a result thereof by increasing numbers of the holes without increasing a space between gates. In FIG. 29, like reference characters refer to like elements shown in FIGS. 17 and 18, detailed explanation of which will be omitted.

This photoreceptor 70A is configured so that plural PDSOI transistors, four transistors in a case shown in FIG. 29, can be arranged along a guide direction of the optical waveguide 61 and can be connected in parallel to each other.

According to the photoreceptor 70A, an area of channel body can be practically expanded so that numbers of the holes existed in the channel body can increase, thereby improving performance relative to operation frequency as photodetector.

Refractive index of Si material is about 3.5. If it is estimated that effective refractive index of light guided in the optical waveguide made of Si material is three, light is guided about 10 cm for a period of time of 1 nsec. Thus, as a principle, if the photoreceptor 70A is configured so that plural PDSOI transistors are arranged in an area having a length of 10 cm or less, this photoreceptor 70A can detect signal of some G Hz.

The photoreceptor in which plural PDSOI transistors are arranged in parallel may have increased leakage current(s) to deteriorate signal quality, so that number of PDSOI transistors to be connected can be limited. The embodiment, however, demonstrates that it is not particularly restricted by only operation frequency, so that if only practical number of PDSOI transistors (for example, less than 100 transistors) are arranged along a guide direction of the optical waveguide 61 and they are electrically connected in parallel to each other to produce a photoreceptor, such the photoreceptor is very effective device for shortening data-acquiring period of time.

Although, in FIG. 29, it has been shown that plural PDSOI transistors are arranged along a guide direction of the optical waveguide 61 in a line, this invention is not limited to this arrangement. For example, they can be arranged in plural lines or at random. It, however, is necessary that plural PDSOI transistors may be arranged in any locations corresponding to locations in the optical waveguide 61 where carriers occur by means of TPA phenomenon by light guided in the optical waveguide 61 and holes remain therein.

Figure 30A:
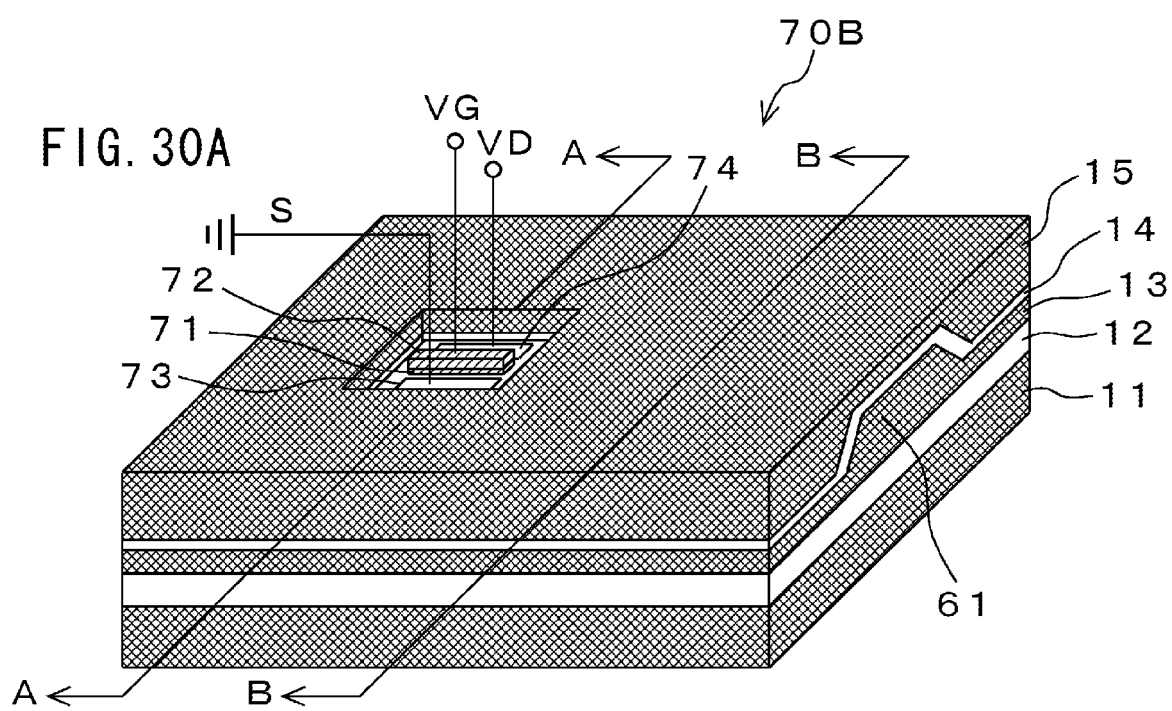
FIGS. 30A through 30C are diagrams each for showing a configuration of further embodiment of photoreceptor.
Figure 30B:
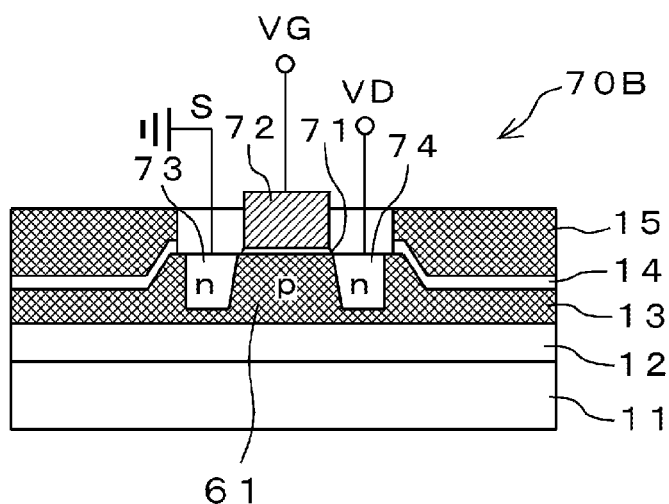
Figure 30C:
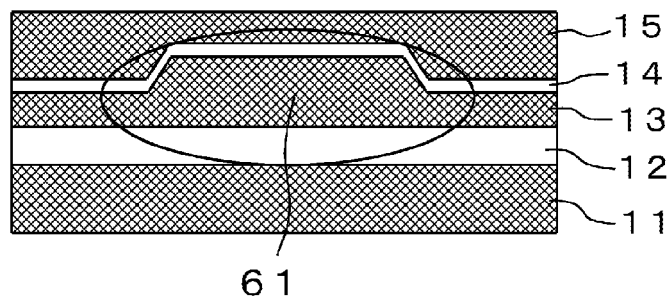

FIGS. 30A through 30C shows a configuration of another embodiment of the photoreceptor 70B that is capable of improving performance relative to operation frequency as the photodetector. FIG. 30A shows a whole configuration thereof; FIG. 30B shows a cross section thereof taken along lines A-A shown in FIG. 30A; and FIG. 30C shows a cross section thereof taken along lines B-B shown in FIG. 30A. In this embodiment, the photoreceptor 70B can increase numbers of the holes without increasing a space between gates and consequently shorten a data-acquiring period of time to increase an amount of signal. In FIGS. 30A through 30C, like reference characters refer to like elements shown in FIG. 18, detailed explanation of which will be omitted.

Relating to a forming location of the photoreceptor 70B, a rectangle portion is removed from the insulating layer 14 and the silicon layer 15. A channel body of PDSOI transistor (MOS transistor) constituting the photoreceptor 70B is formed in the silicon layer 13 constituting a core of the photoreceptor 61.

The following will describe manufacturing steps of the photoreceptor 70B.

Figure 31A:
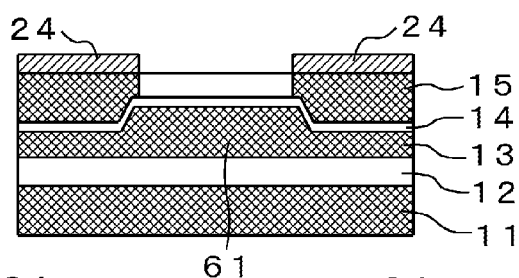
FIGS. 31A through 31F are diagrams each for showing manufacturing step of the photoreceptor.

First, a resist pattern 24 having an opening at a portion thereof corresponding to a location in which the photoreceptor 70B is to be formed is formed as shown in FIG. 31A. A portion of the silicon layer 15, which corresponds to a location in which the photoreceptor 70B is to be formed, is removed therefrom by means of etching.

Figure 31B:
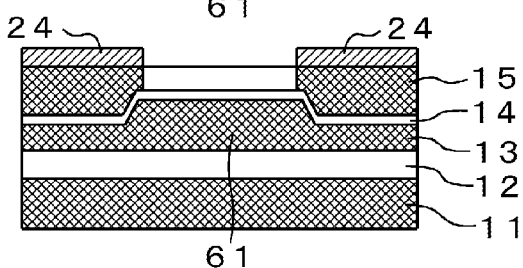

Next, as shown in FIG. 31B, using the resist pattern 24, a portion of the insulating layer 14, which corresponds to a location in which the photoreceptor 70B is to be formed, is removed therefrom by means of etching.

Figure 31C:
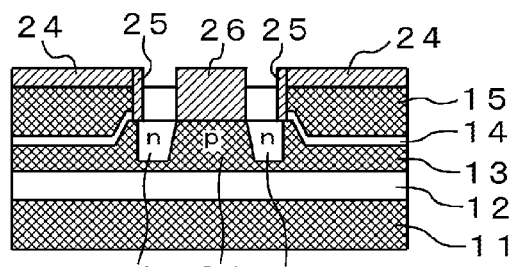

Further, as shown in FIG. 31C, a resist pattern 25 is formed to prevent p-type impurity ion and n-type impurity ion form being implanted into the silicon layer 15. Then, the p-type impurity ion is implanted into the silicon layer 13 to produce p-type silicon layer. A resist pattern 26 is formed on a portion of the silicon layer 13 corresponding to the channel body. The n-type impurity ion is then implanted into the silicon layer 13 to produce source diffusion layer 73 and drain diffusion layer 74.

Figure 31D:
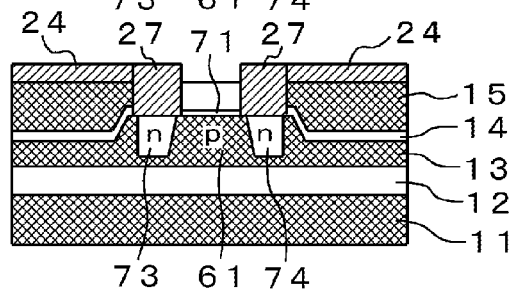

As shown in FIG. 31D, the resist patter 26 is then removed therefrom, as well as resist patterns 27 are formed on the source diffusion layer 73 and the drain diffusion layer 74 and gate insulating layer 71 is also formed corresponding to the channel body.

Figure 31E:
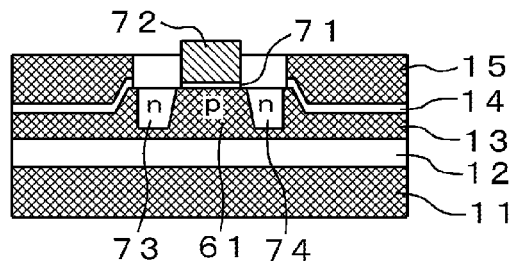
Figure 31F:
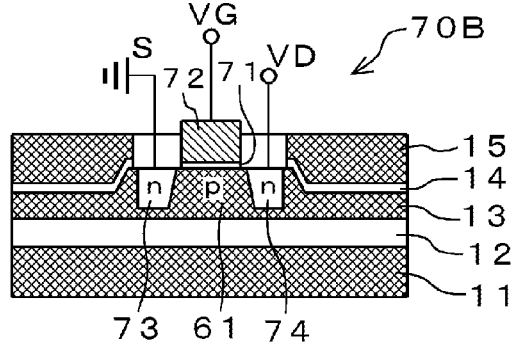

Next, as shown in FIG. 31E, the resist patterns 27 are removed and a gate electrode 72 made of polysilicon is formed on the gate insulating layer 71. As shown in FIG. 31F, electrodes are respectively connected to the source diffusion layer 73, the drain diffusion layer 74, and the gate electrode 72 to produce the photoreceptor 70B.

According to the photoreceptor 70B, the channel body of the PDSOI transistor is formed on the silicon layer 13 constituting the core portion of the optical waveguide 61, so that an area of the channel body can be expanded to increase number of the holes existed in the channel body, thereby allowing performance relative to operation frequency as the photodetector to be improved.

As described above, the photoreceptors 70, 70A, and 70B respectively have PDSOI transistor(s) that has (have) the floating channel body formed on the silicon layer 15 or 13 and a gate (gate electrode 72) for forming a channel that is formed on a surface side of the channel body, so that an ordinary process of manufacturing CMOS can be applied to this manufacture process of the photoreceptors as it is. This attains detection of light guided in the optical waveguide 61 at low price.

Although, in the photoreceptors 70, 70A shown in FIGS. 18 and 29, it has been shown that these photoreceptors 70, 70A have MOS structure such that n-p-n structure of PDSOI transistor constituting each of the photoreceptors 70, 70A can be arranged along a longitudinal direction of the optical waveguide 61 (light-guide direction), these photoreceptors 70, 70A may have MOS structure such that the n-p-n structure of PDSOI transistor can be arranged along a direction that is perpendicular to the longitudinal direction of the optical waveguide 61.

Similarly, although, in the photoreceptor 70B shown in FIGS. 30A through 30C, it has been shown that the photoreceptor 70B has MOS structure such that n-p-n structure of PDSOI transistor constituting the photoreceptor 70B can be arranged along a direction that is perpendicular to the longitudinal direction (light-guide direction) of the optical waveguide 61, the photoreceptor 70B may have MOS structure such that the n-p-n structure of PDSOI transistor can be arranged along a longitudinal direction of the optical waveguide 61.

Although, in these above-mentioned embodiments, the optical waveguide 61 has been formed so that the silicon layer 13 sandwiched between double insulating layers 12 and 14 can have uneven portion extending along a predetermined path and light guided in the optical waveguide 61 can be detected by the PDSOI transistor, this invention is not limited to this. It also can be generally applied to a case where light guided in the optical waveguide 61, in which semiconductor layer (silicon layer) formed on the insulating layer of the substrate has uneven portion extending along a predetermined path, is detected.

Figure 32:
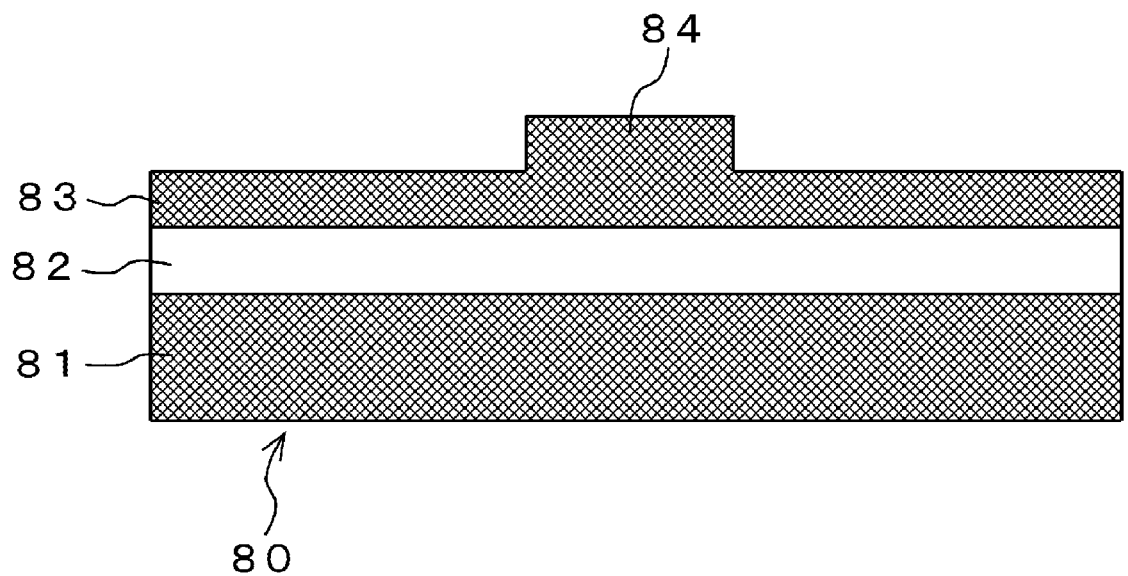
FIG. 32 is a diagram for showing a configuration of another embodiment of SOI substrate.
Figure 33:
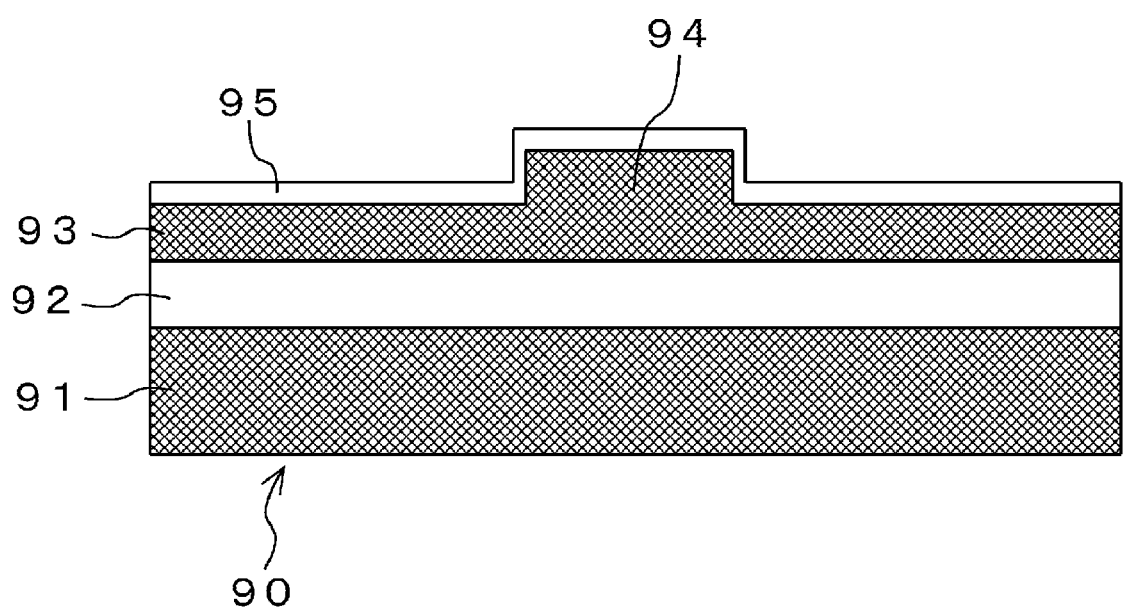
FIG. 33 is a diagram for showing a configuration of further embodiment of SOI substrate.

For example, as shown in FIGS. 32 and 33, I embody SOI substrates 80 and 90 each having an optical waveguide.

The following will describe the SOI substrate 80 shown in FIG. 32. This SOI substrate 80 has a configuration such that silicon layer (single crystal silicon layer) 83 is formed on a silicon substrate 81 via an insulating layer (silicon oxide layer) 82. The silicon layer 83 is etched to have uneven portion extending along a predetermined path, thereby enabling the optical waveguide 84 to be formed. It is to be noted that the silicon substrate 81 constitutes semiconductor substrate; the insulating layer 82 constitutes first insulating layer; and the silicon layer 83 constitutes first semiconductor layer.

The following will describe the SOI substrate 90 shown in FIG. 33. This SOI substrate 90 has a configuration such that silicon layer (single crystal silicon layer) 93 is formed on a silicon substrate 91 via an insulating layer (silicon oxide layer) 92. The silicon layer 93 is etched to have uneven portion extending along a predetermined path, thereby enabling the optical waveguide 94 to be formed. Silicon oxide layer 95 covers the optical waveguide 94. It is to be noted that the silicon substrate 91 constitutes semiconductor substrate; the insulating layer 92 constitutes first insulating layer; the silicon layer 93 constitutes first semiconductor layer, and the silicon oxide layer 95 constitutes second insulating layer.

Figure 34:
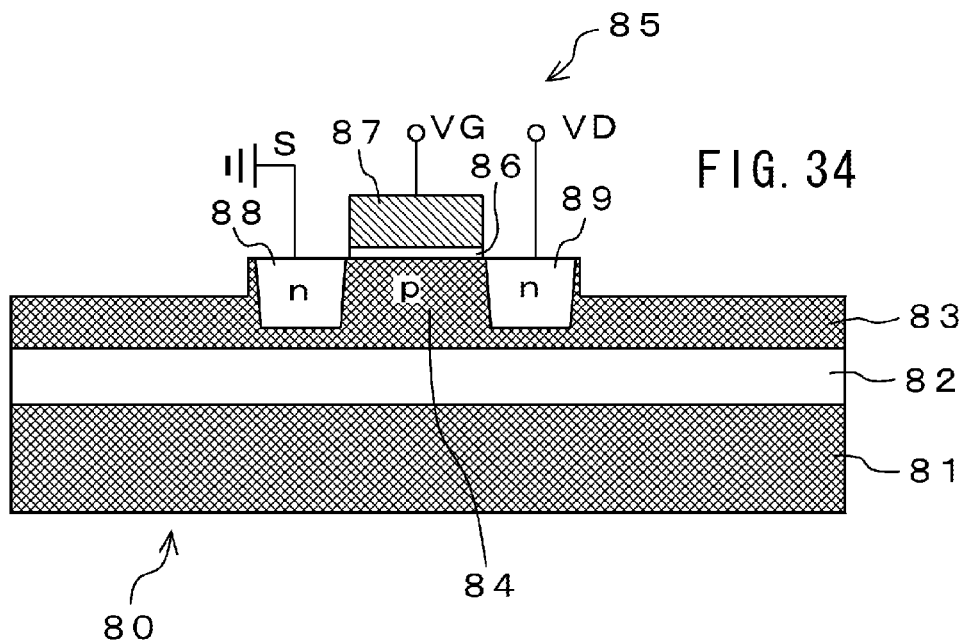
FIG. 34 is a cross-sectional view of still further embodiment of photoreceptor for showing a configuration thereof.
Figure 35:
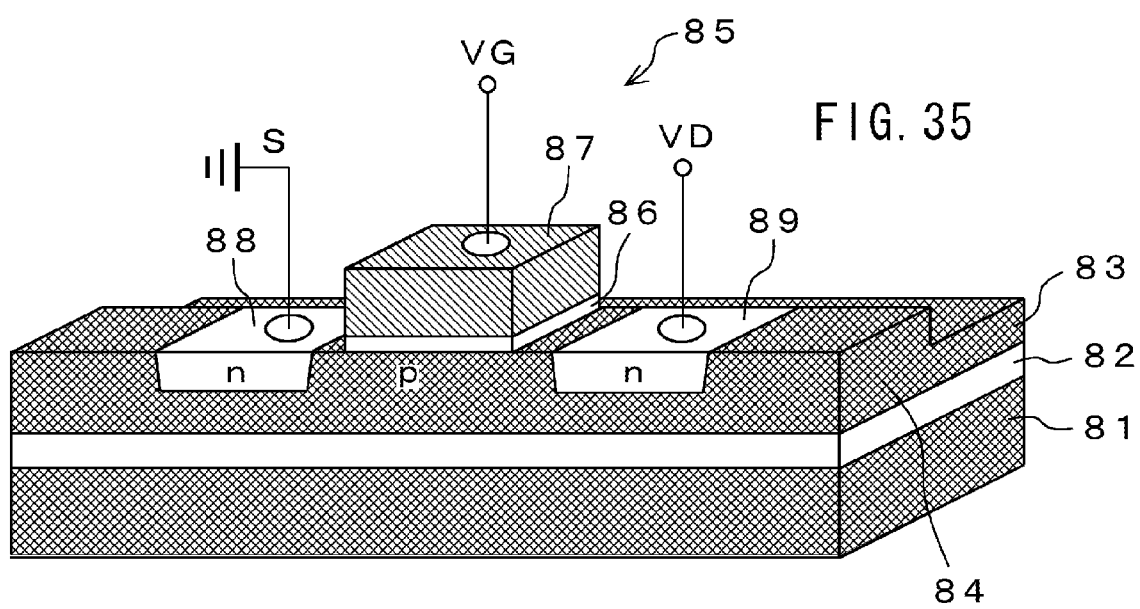
FIG. 35 is a cross-sectional view of additional embodiment of photoreceptor for showing a configuration thereof.

This invention can be applied to a case where light guided in any of the optical waveguides 84, 94 of the SOI substrates 80, 90 shown in FIGS. 32, 33 is detected. In other words, relative to the SOI substrate 80, as shown in FIGS. 34, 35, by forming MOS transistor (PDSOI transistor) as the photoreceptor 85 corresponding to a predetermined position along a guiding direction of the optical waveguide 84, it is possible to detect light guided in the optical waveguide 85. In this case, p-type silicon layer 83 is set as channel body and gate electrode 87 is formed on a surface of the p-type silicon layer 83 via gate insulating layer 86. Source diffusion layer 88 and drain diffusion layer 89 are formed so as to have a depth reached to the insulating layer 82. Thus, PDSOI transistor can be configured. Although detailed explanation thereof will be omitted, operations for detecting light in the photoreceptor 85 are similar to those for the above photoreceptor 70 (see FIGS. 17 and 18).

In the photoreceptor 85 shown in FIG. 34, it has been shown that the photoreceptor 85 have MOS structure such that n-p-n structure of PDSOI transistor constituting the photoreceptor 85 can be arranged along a direction that is perpendicular to a longitudinal direction (light-guide direction) of the optical waveguide 84. In the photoreceptor 85 shown in FIG. 35, it has been shown that the photoreceptor 85 have MOS structure such that the n-p-n structure of PDSOI transistor constituting the photoreceptor 85 can be arranged along a longitudinal direction of the optical waveguide 84.

Relative to the SOI substrate 90, similar to the above SOI transistor 80, by forming PDSOI transistor as the photoreceptor corresponding to a predetermined position along a guiding direction of the optical waveguide 94 (see FIGS. 34 and 35), it is possible to detect light guided in the optical waveguide 94.

Although it has been shown in the above embodiments that PDSOI transistor is positioned on clad portion (see FIG. 17) or core portion (see FIGS. 30, 34, 35) of each of the optical waveguides 61, 84, 94, PDSOI transistor can be positioned on any portion where carriers occur by TPA phenomenon and holes remain therein (a position in which electric field of light guided in an optical waveguide exists).

Although the optical waveguide 61 of double-SOI substrate 10 has been manufactured by means of SIMOX method in the above embodiments, such the optical waveguide 61 can be manufactured by another method.

According to the above embodiment of the invention, it is possible to detect light guided in the optical waveguide formed on the semiconductor substrate at low price. Thus, this invention can be applied to a semiconductor device in which optical communication is performed between or among desired functional devices. It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device comprising:
   a substrate that contains a semiconductor substrate, a first insulating layer formed on the semiconductor substrate, a first semiconductor layer formed on the first insulating layer, a second insulating layer formed on the first semiconductor layer, a second semiconductor layer formed on the second insulating layer, a gate insulating layer formed on the second semiconductor layer, and a gate electrode layer formed on the gate insulating layer, in this order;
   an optical waveguide that is formed along a predetermined path, said optical waveguide being formed by making the first semiconductor layer non-uniformed in thickness thereof; and
   a photoreceptor having MISFET containing a floating channel body that is formed by the second semiconductor layer on a position of the first semiconductor layer in which electric field of light guided inside the optical waveguide exists and a gate for forming channel formed on a front surface side of the channel body.

2. The semiconductor device according to claim 1, further comprising a local insulating layer that separates a region of the first semiconductor layer in which the optical waveguide is formed from another region of the first semiconductor layer.

3. The semiconductor device according to claim 1 wherein the photoreceptor is constituted by connecting a plurality of the MISFETs in parallel, said MISFETs being arranged along a guide direction of the optical waveguide.

* * * * *